United States Patent [19]

Hatakoshi et al.

[11] Patent Number: 4,893,313
[45] Date of Patent: Jan. 9, 1990

[54] SEMICONDUCTOR LASER DEVICE WHICH HAS A DOUBLE-HETERO STRUCTURE HAVING AN OPTIMAL LAYER THICKNESS

[75] Inventors: Genichi Hatakoshi, Yokohama; Kazuhiko Itaya, Tokyo; Shigeya Naritsuka, Yokohama; Masayuki Ishikawa, Nishimine; Hajime Okuda, Yokohama; Hideo Shiozawa, Yokohama; Yukio Watanabe, Yokohama; Yasuo Ohba, Yokohama; Yoshihiro Kokubun, Yokohama; Yutaka Uematsu, Yokohama, all of Japan

[73] Assignee: Kabushiki Kaisha Toshiba, Kawasaki, Japan

[21] Appl. No.: 323,400

[22] Filed: Mar. 14, 1989

[30] Foreign Application Priority Data

Mar. 14, 1988 [JP] Japan ............................ 63-59908
May 13, 1988 [JP] Japan ............................ 63-114747
May 13, 1988 [JP] Japan ............................ 63-114750
May 13, 1988 [JP] Japan ............................ 63-114751

[51] Int. Cl.$^4$ ............................................. H01S 3/19
[52] U.S. Cl. ............................. 372/46; 372/45; 357/16; 357/17
[58] Field of Search ............... 372/43, 45, 46; 357/16, 357/17

[56] References Cited

U.S. PATENT DOCUMENTS 4,792,958 12/1988 Ohba et al. ......................... 372/45
4,799,228 1/1989 Nagasaka et al. .................. 372/46
4,809,287 2/1989 Ohba et al. ......................... 372/45

FOREIGN PATENT DOCUMENTS 62-200785 9/1987 Japan .
62-200786 9/1987 Japan .
63-43387 2/1988 Japan .

OTHER PUBLICATIONS

Electron Letters, vol. 23, No. 24, pp. 1327-1328; S. Kawata et al., Nov. 19, 1987.

Primary Examiner—William L. Sikes
Assistant Examiner—B. R. R. Holloway
Attorney, Agent, or Firm—Oblon, Spivak, McClelland, Maier & Neustadt

[57] ABSTRACT

In a semiconductor laser device, for emitting a laser beam having a wavelength $\lambda$, an n-type $In_{0.5}(Ga_{1-x}Al_x)P$ first cladding layer is formed on an n-type GaAs substrate. An undoped InGaP active layer is formed on the first cladding layer and a p-type $In_{0.5}(Ga_{1-x}Al_x)_{0.5}P$ cladding layer is formed on the active layer. A p-type InGaP cap layer is formed on the second cladding layer and an n-type GaAs current restricting layer is formed on the second cladding layer. The aluminum composition ratio x of the cladding layer is 0.7. The active layer has a thickness of 0.06 $\mu$m and the cladding layers have the same thickness H of 0.85 $\mu$m. The active layer and the cladding layers have refractive indices $n_a$ and $n_c$ which satisfies the following inequalities:

$$0.015\Delta^{\frac{1}{2}} < d/\lambda < 0.028\Delta^{-\frac{1}{2}}$$

and $$\Delta = (n_a^2 - n_c^2)/2n_a^2$$

23 Claims, 22 Drawing Sheets

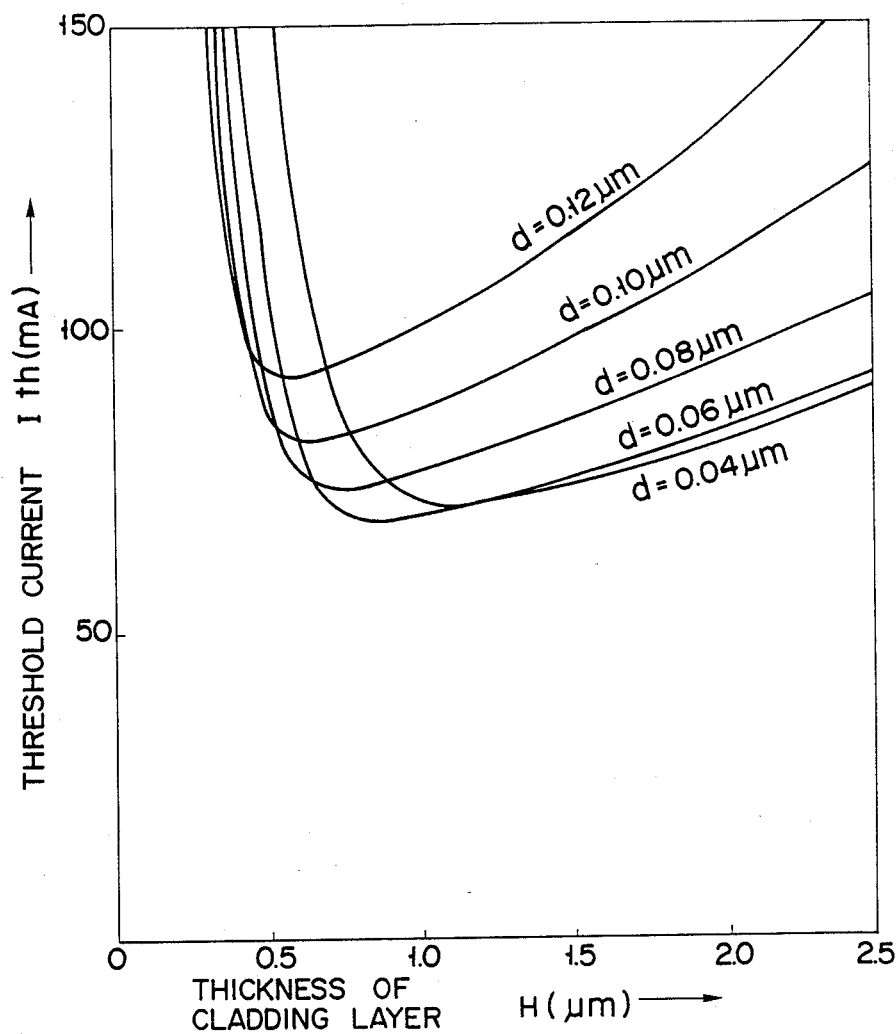
F I G. 9

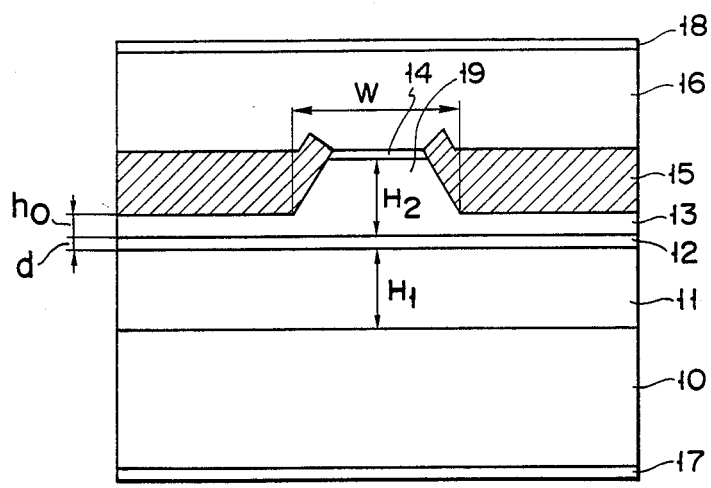
F I G. 10
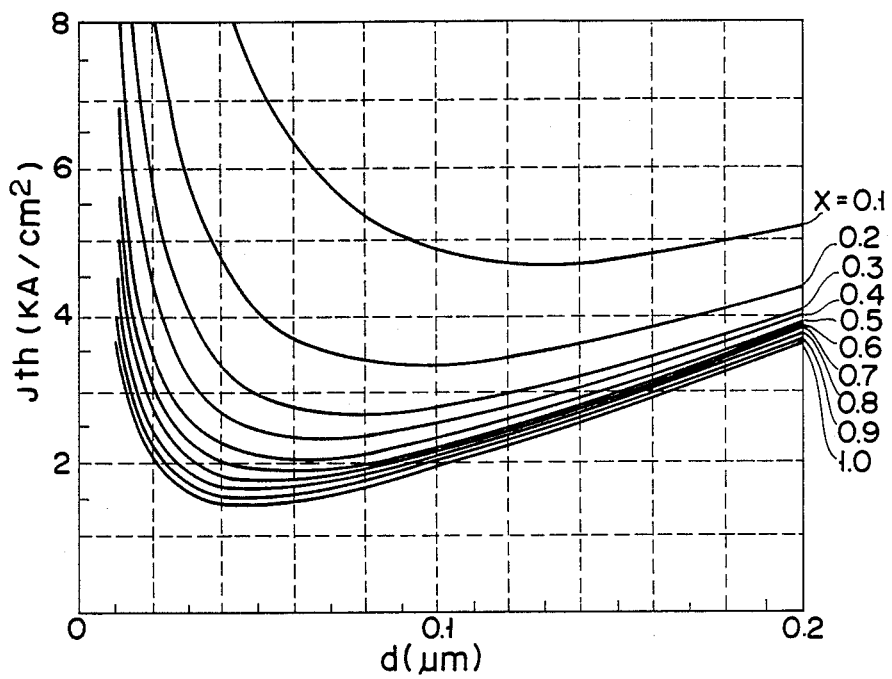
F I G. 11

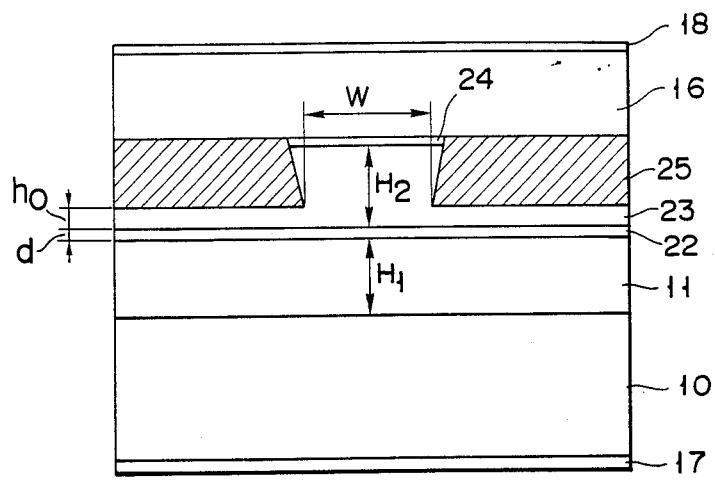
F I G. 21
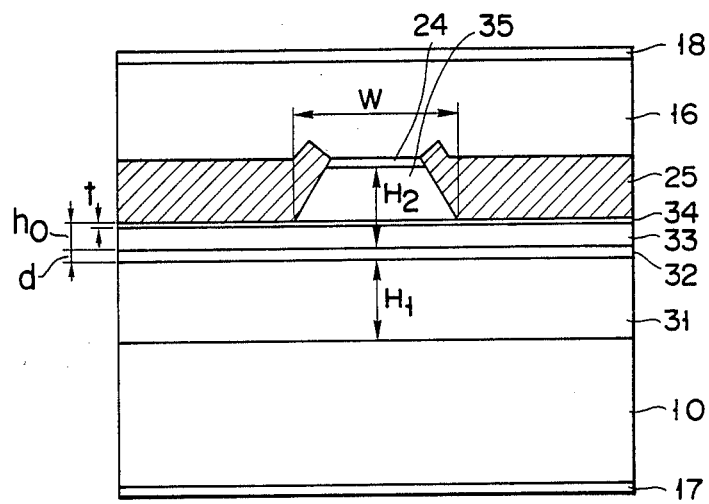
F I G. 22

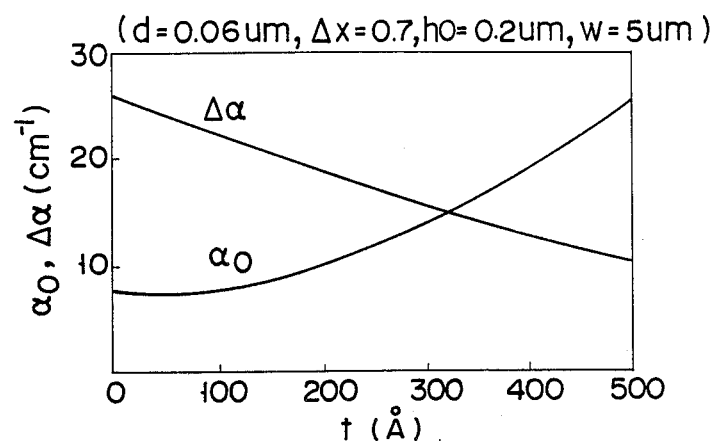
F I G. 23
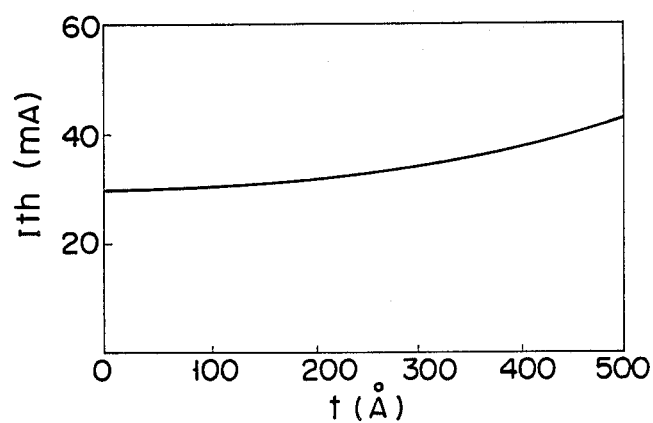
F I G. 24

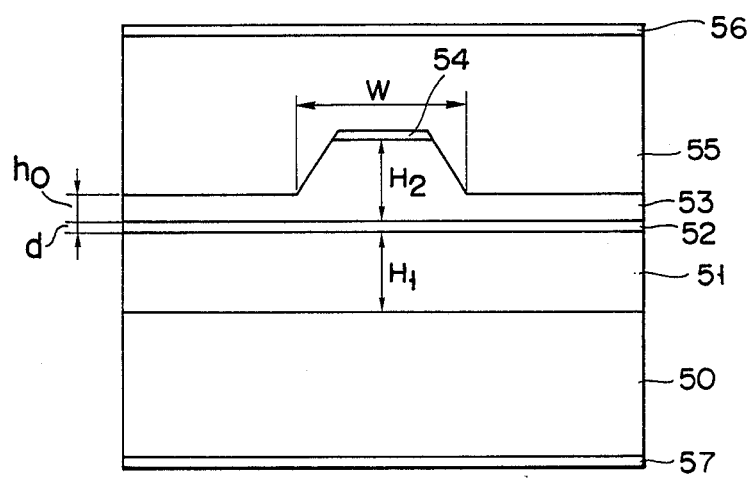
F I G. 25

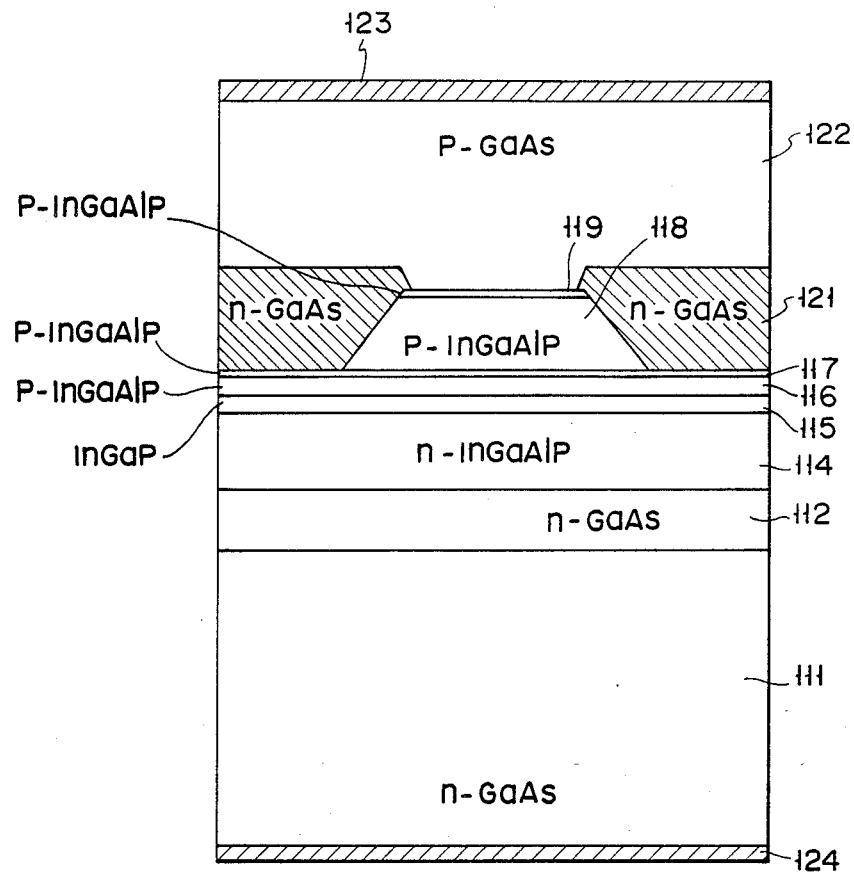
F I G. 26

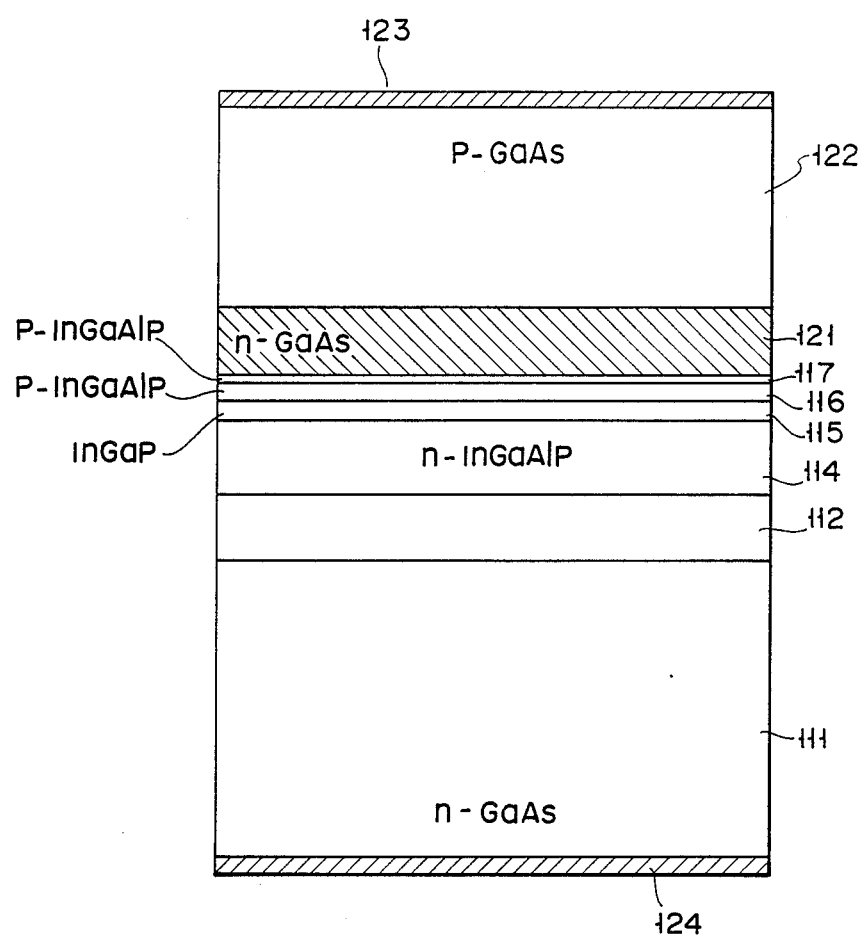
F I G. 27

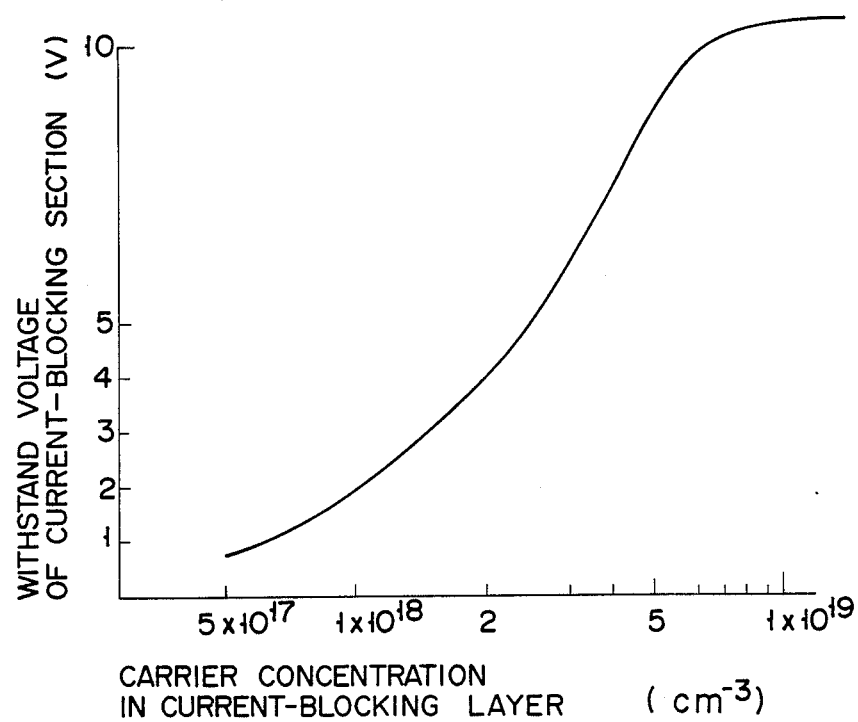
F I G. 28

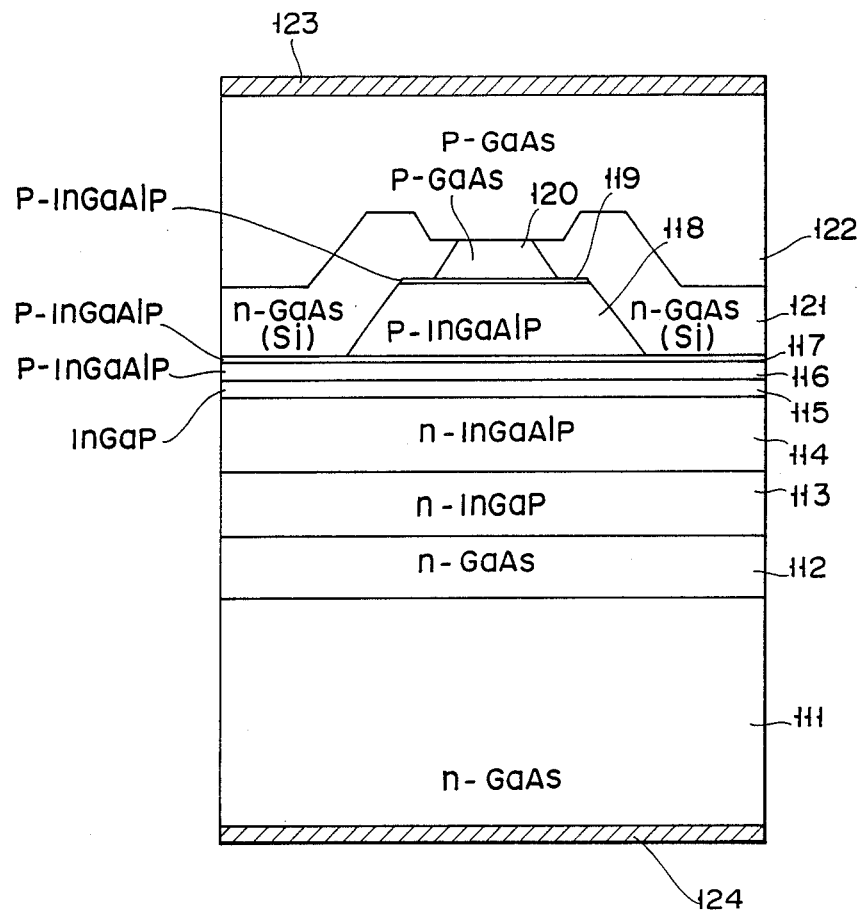
F I G. 30

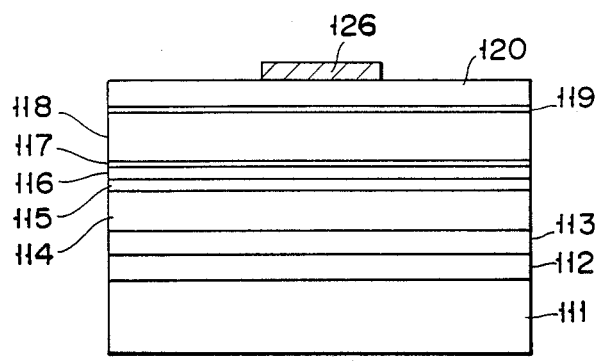
F I G. 31A
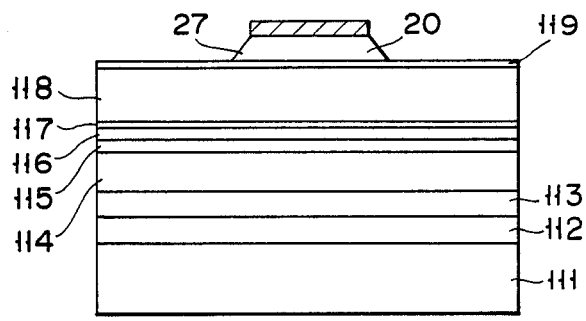
F I G. 31B
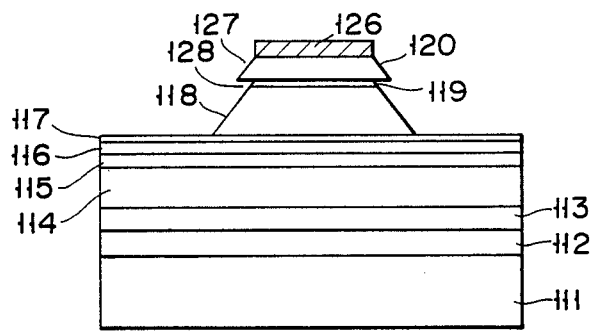
F I G. 31C

SEMICONDUCTOR LASER DEVICE WHICH HAS A DOUBLE-HETERO STRUCTURE HAVING AN OPTIMAL LAYER THICKNESS

BACKGROUND OF THE INVENTION

1. Field of the Invention

The present invention relates to a semiconductor laser device for use in an optical information-processing apparatus, an optical measuring apparatus, or the like, and more particularly to a semiconductor laser device which has a double-hetero structure having an optimal layer thickness.

2. Description of the Related Art

In recent years, development has been made of short-wave semiconductor lasers for use in high-density optical disk systems, high-speed laser printers, bar code readers, or the like. Of these semiconductor lasers, the InGaAlP laser, which emits a beam having a wavelength of 0.6 µm (read-light range), can be used in place of the existing He-Ne gas laser for a variety of uses. Therefore, much attention is paid to the InGaAlP laser in the fields of optical data processing and optical measuring, since it can be a small, light, and low power-consumption light source. This semiconductor laser must have as good characteristics and reliability as those of the conventional GaAlAs laser, if it is to be used practically.

GaAlAs lasers of various structures have been developed. Each of these lasers has specific structural parameters, and has desired characteristics by virtue of these structural parameters. In other words, optimal structural parameters are known for each type of a GaAlAs laser. By contrast, no structural parameters which seem the most desirable for an InGaAlP laser have been proposed. This is because the InGaAlP laser is rather a novel type of a semiconductor laser, and the physical properties of experimental InGaAlP lasers have yet to be evaluated completely.

The experiments, which the Inventors hereof have conducted, show that the oscillation threshold value of an InGaAlP laser greatly depends upon the thickness of its active layer. The experiments also suggest that an InGaAlP laser cannot be sufficiently reliable unless its active layer has an optimal thickness. Hence, it is required that the active layer of an InGaAlP laser have an optimal thickness.

An InGaAlP material is greatly different from a GaAlAs material in thermal resistivity. For example, GaAs and $Ga_{0.6}Al_{0.4}$ have the thermal resistivities of 2K cm/W and 8K cm/W, respectively, whereas $In_{0.5}(Ga_{0.3}Al_{0.7})_{0.5}P$ has the thermal resistivity of 17K cm/W. When the cladding layer of a semiconductor laser is made of InGaAlP, the laser has a high thermal resistance. Thus, during the operation of the laser, its active layer will be heated to a high temperature, and the threshold current of the laser will inevitably increase. Therefore, the InGaAlP laser has unstable thermal characteristics and inadequate reliability.

As is generally known, the characteristics of a GaAlAs laser are more influenced by the stripe width and the cavity length than by the other structural parameters. (See W.B. Joice et al., *Journal of Applied Physics*, Vol. 46, pp. 855–862, 1975.) In the case of an InGaAlP laser, the thickness of the cladding layer is one of the structural parameter which greatly influence the thermal resistance of the laser. The cladding layer of most conventional semiconductor laser has a thickness of 1 µm or more, being thick enough to prevent the waveguiding mode from being affected by the substrate or the contact layer. In the case of an InGaAlP laser, as the results of the experiments conducted by the inventors hereof have revealed, when the cladding layer is 1 µm or more thick, the threshold current for CW operation increases too much in contrast with the case for pulsed operation. Consequently, the InGaAlP laser fails to have good thermal characteristics or sufficient lifetime.

Various methods of reducing the thermal resistance of the InGaAlP laser have been proposed Japanese Patent Disclosures No. 61-28069 and No. 62-81783 disclose an InGaAlP laser whose cladding layer consists of two layers, the outer one of which is made of material having a low thermal resistivity. Japanese Patent Disclosures No. 62-51282 and No. 62-51283 disclose an InGaAlP laser which comprises a cladding layer formed of a superlattice. Either InGaAlP laser has a complex structure, and many interfaces involve in growing crystals. Hence, many manufacture parameters must be controlled to manufacture the laser. Consequently, the InGaAlP laser cannot be manufactured in a high yield or exhibit sufficient reliability.

As has been pointed out, the structural parameters of a InGaAlP semiconductor laser have yet to be optimized. In particular, the thickness of the active layer is not optimal, and the oscillation threshold value of the laser is excessively great. Further, since the thickness of the cladding layer is not optimal, the InGaAlP laser fails to have good thermal characteristics or sufficient reliability.

When a semiconductor laser is used as a light source in an optical information-processing apparatus, its transverse mode must be controlled. Known as an InGaAlP laser, whose transverse mode can be controlled, is a ridge-stripe SBR laser. (See extended abstracts, 19th Conf. Solid/state Devices and Materials, Tokyo, 1987, pp. 115–118.) This laser can emits a beam in fundamental transverse mode, owing to its specific structural parameters. However, the structural parameters of the ridge-stripe SBR laser have not been optimized so as to reduce astigmatism or to stabilize the transverse mode. The optical characteristics of the laser greatly changes in accordance with the compositions forming the lasers, the thickness of the active layer, the width of the stripe, and the like. For example, no difference can be made between the layers in effective refractive index, with respect to the horizontal direction consequently, the ridge-stripe SBR laser functions almost in the same way as a gain-waveguide laser, whereby the astigmatism inevitably increases. Further, it operates in a high-order mode unless the stripe width and some other structural parameters are optimized. If this is the case, the current-output characteristic drastically alters in a low-power region, and the laser cannot be used in some types of optical disk apparatuses. No quantitative analysis has been made of the dependency of the current-output characteristic upon the structural parameters. Therefore, no ranges are known within which the structural parameters should fall so that the ridge-stripe SBR laser may have a good current-output characteristic.

The inventors hereof have been conducting researches in order to provide a semiconductor laser which has an InGaAlP layer and a GaAs layer, both formed by MOCVD method, and a single fundamental mode. The inventors have found it that a semiconductor laser of the conventional structure, whose comprises a cladding layer having stripes and current-blocking layers extending beside the stripes can hardly operate reliably or the manufactured with a high yield. This is because a leakage current flows in the current-blocking layers, disabling the laser to emit a sufficiently intense beam The inventors have also found that selenium, which is the n-type dopant contained in the current-blocking layers, diffuses into the p-type cladding layer formed on the active layer, inevitably rendering the cladding layer n-type, and further diffuses into the n-type cladding layer formed below the active layer. In consequence, the current-blocking layers can no longer block a current to a sufficient degree, disabling the laser to emit a sufficiently intense beam.

SUMMARY OF THE INVENTION

It is an object of the present invention is to provide an InGaAlP semiconductor laser device which has optimal structural parameters and, therefore, a small threshold current, and is sufficiently reliable.

Another object of the invention is to provide an InGaAlP semiconductor laser device which has optimal structural parameters and, therefore, has good thermal characteristics and high reliability.

Still another object of this invention is to provide an InGaAlP semiconductor laser device which has a current-restricting structure and can operate quite reliably.

According to the present invention, there is provided a semiconductor laser device which emits a beam having a wavelength $\lambda$ and comprises:

a double-hetero structure including:

an active layer made of $In(Ga_{l-y}Al_y)P$ and having a thickness d and a refractive index $n_a$, and first and second surfaces;

a first cladding layer of a first conductivity type formed on the first surface of the active layer having a refractive index $n_c$, made of $In(Ga_{l-y}Al_y)P$, where x and y satisfy the inequality of $0 \leq y < x \leq 1$; and a second cladding layer of a second conductivity type formed on the second surface of the active layer, having a refractive index $n_{c2}$, and made of $In(Ga_{l-z}Al_z)P$, where y and z satisfy the inequality of $0 \leq y < z \leq 1$, wherein said double-hetero structure satisfies the following inequality:

$$0.015\Delta^{-\frac{1}{2}} < d/\lambda < 0.028\Delta^{-\frac{1}{2}}$$

where is specific refractive index difference defined as:

$$\Delta = (\Delta_1 + \Delta_2)/2$$

$$\Delta_1 = (n_a^2 - n_c^2)/(2n_a^2)$$

and $$\Delta_2 = (n_a^2 - n_{c2}^2)/(2n_a^2).$$

Further, according to the present invention, there is provided a semiconductor laser device which emits a beam having a wavelength $\lambda$ and comprises:

a semiconductor substrate of a first conductivity type;

an active layer made of $In_{l-v}(Ga_{l-y}Al_y)v^P$ and having a thickness d, and having first and second surfaces, which satisfies the inequality of $0.03 \ \mu m \leq d \leq 0.1 \ \mu m$;

a first cladding layer of the first conductivity type formed between the substrate and the first surface of said active layer and made of $In_{l-v}(Ga_{l-x}Al_x)v^P$, where v is a composition ratio satisfy the inequality of $0 \leq v \leq 1$;

a cladding structure including a second cladding layer of a second conductivity type formed on the second surface of the active layer having a refractive index $n_c$, made of $In_{l-v}(Ga_{l-z}Al_z)v^P$, and having a flat section and a stripe-shaped ridge section protecting from the flat section, where composition ratio x, y and z satisfying the inequality of $0 \leq y < x$, $z \leq 1$, the aluminum ratio x and z of the cladding layers being satisfy the inequality of $0.65 \leq x$, $z \leq 0.8$; and a confining layer formed on the flat section of the second cladding layer for confining the laser beam.

BRIEF DESCRIPTION OF THE DRAWINGS

FIG. 9 is a diagram representing how the threshold current $I_{th}$ changes with the thickness H of the cladding layer, at various values for the thickness d of the active layer;

FIG. 10 is a sectional view showing a semiconductor laser according to a second embodiment of the present invention;

FIG. 11 is a diagram representing how the density Jth of the threshold current of the double-hetero (InGaP-/InGaAlP) structure shown in FIG. 10 changes with the thickness d of the active layer of the laser;

FIGS. 21 and 22 are sectional views showing two modifications of the semiconductor laser shown in FIG. 10, respectively;

FIG. 23 is a diagram showing the calculated dependencies of Δα and α₀ upon the thickness t of the second cladding layer, which may be observed in the laser shown in FIG. 21;

FIG. 24 is a diagram showing the calculated dependency of the oscillation threshold value upon the thickness t of the second cladding layer, which may be observed in the laser shown in FIG. 21;

FIG. 25 is a sectional view illustrating a third modification of the semiconductor laser shown in FIG. 10;

FIG. 26 is a sectional view schematically showing a semiconductor laser according to a third embodiment of the present invention;

FIG. 27 is a sectional view of the current-blocking section of the semiconductor laser shown in FIG. 28;

FIG. 28 is a diagram illustrating the relationship between the withstand voltage and carrier concentration of the current-blocking layer of the laser shown in FIG. 26;

FIG. 30 is a sectional view showing a semiconductor laser according to a fourth embodiment of the present invention; and FIGS. 31A to 31F are sectional views, explaining how the semiconductor laser shown in FIG. 30 is manufactured.

DETAILED DESCRIPTION OF THE PREFERRED EMBODIMENTS

Figure 1:
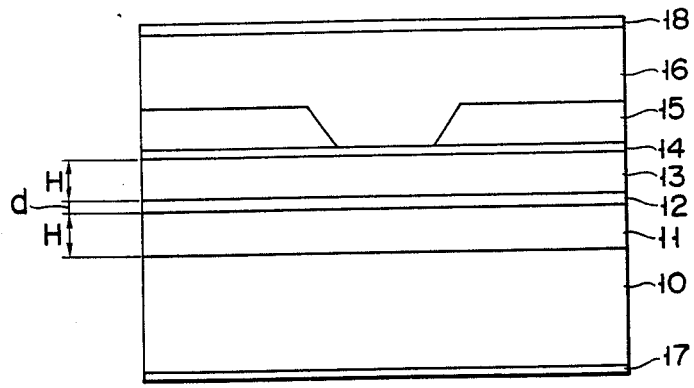
FIG. 1 is a sectional view showing a semiconductor laser according to a first embodiment of the present invention.

FIG. 1 schematically illustrates a semiconductor laser according a first embodiment of the present invention. As this figure shows, an n-type $In_{0.5}(Ga_{1-x}Ag_x)_{0.5}P$ cladding layer 11 is formed on an n-type GaAs substrate 10. An undoped InGaP active layer 12 is formed on the cladding layer 11. Further, a p-type $In_{0.5}(Ga_{1-x}Ag_x)_{0.5}P$ cladding layer 13 is formed on the active layer 12, whereby the layers 11, 12 and 13 constitute a double-hetero structure. A p-type InGaP cap layer 14 is formed on the cladding layer 13. An n-type GaAs layer 15 for restricting an electric current is formed on the cap layer 14. The layer 15 has a slit, thus exposing a portion of the cap layer 14. A contact layer 16 is formed on the exposed portion of the cap layer 14 and also on the current-restriction layer 15. An n-type electrode 17 is formed on the lower surface of the substrate 10, and a p electrode 18 is formed on the upper surface of the contact layer 16. The aluminum composition ratio x of the cladding layer 11 is 0.7 The active layer 12 has a thickness d of 0.06 μm. Both cladding layers 11 and 13 have the same thickness H of 0.85 μm.

The parameters, which determine the specific structure of the semiconductor laser, will be explained.

Generally, the threshold-current density $J_{th}$ of a semiconductor laser is given as follows:

$$J_{th}=J_o d/\eta_i+\{d/(\eta_i \Gamma a \beta)\}\{\alpha_i+(1/L)\ln(1/R)\} \quad (1)$$

where $\eta_i$ is the internal quantum efficiency, Γa is the light-confinement factor of the active layer, $\alpha_i$ is the sum of the free-carrier loss and the waveguide mode loss, L is the cavity length, R is the facet reflectivity, $J_o$ and β are coefficients representing the gain characteristics of the laser, both determined by the materials of the laser. $\alpha_i$ can be obtained using the dependence of external quantum efficiency on cavity length, and $\eta_i$ can be obtained from the life-time of non-radiative recombination and the radiative recombination constant for spontaneous emission (The non-radiative recombination life-time has been calculated from the delay time of the oscillation.) Eq. (1) represents a definition of Jo and g, so these parameters can be obtained experimentally by estimating the dependence of $J_{th}$ on cavity length. $\Gamma_a$ and R are determined by the waveguide structure, mainly by the refractive indices and thicknesses of the active layer 12 and the cladding layers 11 and 13. They are given as the functions of the thickness d of the active layer and the difference Δ of the specific refractive indices, provided that the cladding layer 11 is sufficiently thick, and the refractive index of the active layer 12 little depends upon the composition of the layer 12. The difference Δ is defined by the following equation:

$$\Delta=(n_a^2-n_c^2)/(2n_a^2) \approx (n_a-n_c)/n_a \quad (2)$$

where $n_a$ and $n_c$ are refractive indices of active layer 12 and cladding layers 11 and 13, respectively.

Figure 2:
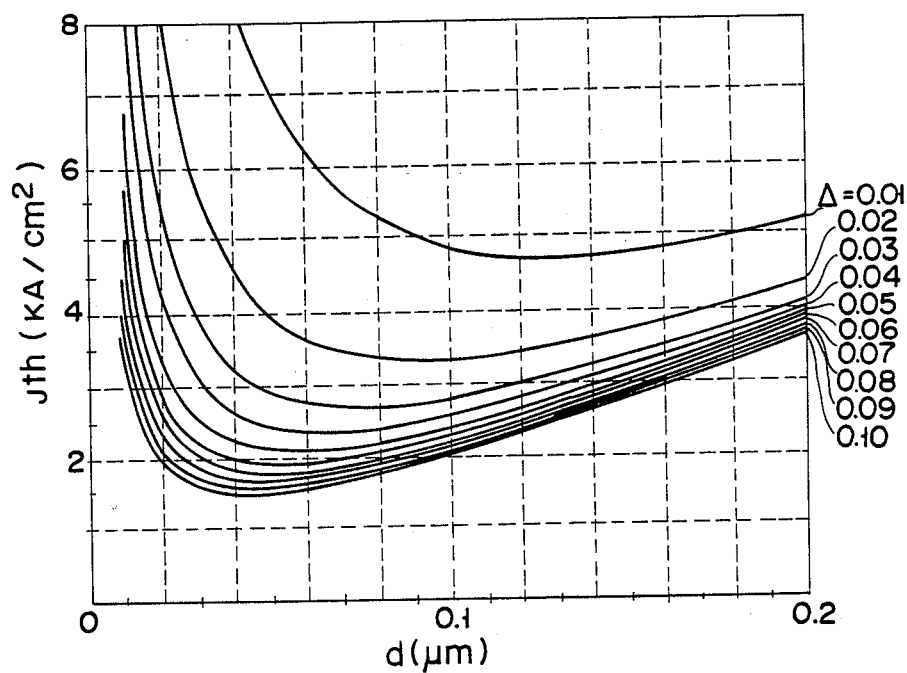
FIG. 2 is a diagram representing how the threshold-current density $J_{th}$ of the laser shown in FIG. 1 changes with the thickness d of the active layer of the laser, at various values for the difference $\Delta$ of the specific refractive index.

When the cavity length remains unchanged, the threshold current density $J_{th}$ is given as the function of d and Δ. Therefore, the optimum thickness d of the active layer 12, which minimizes the threshold current density $J_{th}$ for given Δ, can be determined when the values for $\alpha_i$, $\eta_i$, $J_o$, and β are known. A semiconductor laser of the structure shown in FIG. 1 was actually made, and the parameters thereof were evaluated. The results were: $\alpha_i=10$ cm$^{-1}$; $\eta_i=0.61$; $J_o=9 \times 10^3$ A/cm$^2$/μm; and $\beta=2.1 \times 10^{-2}$ cm.μm/A. The threshold current density $J_{th}$ was calculated from these values, assuming that L = 300 μm, and the difference Δ ranges from 0.01 to 0.10. The results were as shown in FIG. 2. The cladding layers 11 and 13 of the laser, which were made of $In_{0.5}(Ga_{1-x}Ag_x)_{0.5}P$ had refractive index n which is given as follows:

$$n = 3.65 - 0.38x \qquad (3)$$

Therefore, the difference $\Delta x$ between the aluminum composition ratio of the active layer 12 and that of the cladding layers 11 and 13 is related to the specific refractive index difference $\Delta$ as follows:

$$\Delta \approx 0.1 \Delta X \qquad (4)$$

Figure 3A:
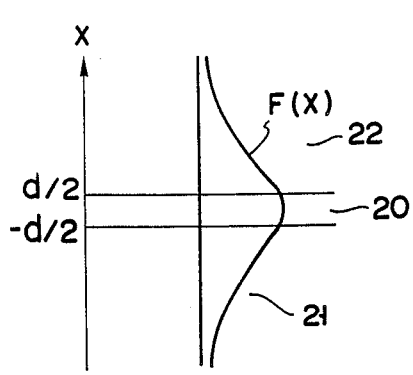
FIGS. 3A and 3B schematically illustrate the three-layer waveguide which are incorporated in the semiconductor laser shown in FIG. 1.

As can be understood from FIG. 2, there is an optimal value for the thickness d of the active layer 12, which minimizes $J_{th}$ at a given value of the difference $\Delta$. To explain the relationship between the optimal thickness d and the difference $\Delta$ qualitatively, it will be discussed what relationship d and $\Gamma_a$ have. For simplicity's sake, the discussion is limited to the three-layer waveguide shown in FIG. 3A, which consists of an active layer 20 and two cladding layers 21 and 22. Let the mode function of this waveguide be denoted as:

$$F(x) = \begin{cases} \cos(\kappa x) & |x| \leq d/2 \\ \cos(\kappa \cdot d/2)\exp(-\gamma|x|) & |x| \geq d/2 \end{cases} \qquad (5)$$

Then, the confinement factor $\Gamma_a$ is given as:

$$\Gamma_a = \{d + 2\gamma/(2K_o^2 n_a^2 \Delta)\}/(d + 2/\gamma) \qquad (6)$$

The values of $\kappa$ and $\gamma$ are given as follows, due to the boundary conditions and the like:

$$\tan(\kappa d/2) = \gamma/\kappa \qquad (7)$$

$$\gamma^2 + \kappa^2 = 2k_o^2 n_a^2 \Delta d \qquad (8)$$

Thus, when both d and $\Delta$ are small, $\gamma$ can be approximated as follows:

$$\gamma \approx k_o^2 n_a^2 \Delta d \qquad (9)$$

where $k_o = 2\pi/\lambda$, wherein $\lambda$ is the wavelength of the laser beam. Assuming that d is sufficiently small, we can obtain the following equation by substituting equation (9) into equation (6):

$$\Gamma_a = k_o^2 n_a^2 \Delta d^2 \qquad (10)$$

Equation (10) is substituted into equation (1), and then the equation is differentiated with respect to d. By setting the differentiated function to 0, the thickness d which will reduce $J_{th}$ to a minimum is obtained. Namely:

$$d^2 = (1/\Delta)\{\alpha_i + (1/R)\}/(k_o^2 n_a^2 J_o \beta) \qquad (11)$$

Here, it is assumed that d does not greatly depend on the facet reflectivity R. The thickness d which minimize $J_{th}$ is given as:

$$d/\lambda = \Delta^{-\frac{1}{2}}\{\alpha_i + (1/L)(Ln(1/R))\}/(J_o \beta)^{\frac{1}{2}}/2\pi n_a$$

When L = 300 μm, and R = 34%, then:

$$d/\lambda \approx 0.022\Delta \qquad (13)$$

The cavity length ranges from 200 to 400 μm in most semiconductor lasers. Hence, the thickness d shown in equation (13) represents the optimal thickness of the active layer, which will minimize the threshold current density $J_{th}$.

Figure 4:
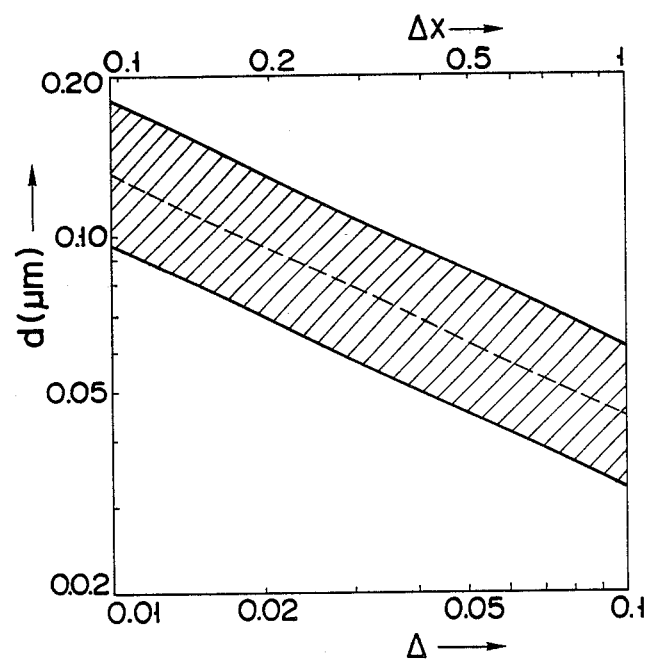
FIG. 4 is a characteristic diagram showing the relationship which the difference $\Delta$ and the thickness d have when the threshold-current density $J_{th}$ is minimum.

A similar results will be obtained directly from equation (1). The broken line shown in FIG. 4 represents the relationship between the thickness d and the difference $\Delta$, which will reduce $J_{th}$ to a minimum. In FIG. 4, the shaded region indicates the range for the thickness d, within which $J_{th}$ is equal to at most 1.05 times the minimum value. The broken line, and the two solid lines showing the upper and lower limits of the thickness range have a slope of approximately $-\frac{1}{2}$, when both d and $\Delta$ are plotted on the logarithmic scales. As is evident from equation (13), d $\propto \Delta^{-\frac{1}{2}}$. Further, as can be understood from FIG. 4, d/$\lambda$ falls within the following range when $\Delta$ ranges from 0.05 to 0.1:

$$0.015\Delta^{-\frac{1}{2}} < d/\lambda < 0.028\Delta^{-\frac{1}{2}} \qquad (14)$$

Equation (14) suggests that the threshold current density $J_{th}$ does not increase over 1.05 times its minimum value as has been pointed out. The increase in the threshold current, which results in this small increase of $J_{th}$, can be neglected. It follows that, when the active layer has a thickness d failing within the range given by equation (14), the InGaAlP semiconductor laser has a sufficiently small threshold current. Equation (13) shows the value for the difference $\Delta$ of the specific refractive indices, which is substantially halfway between the lower and upper limits of $\Delta$ as is evident from the diagram of FIG. 4.

The optimization of the thickness of the cladding layers 11 and 13 will be discussed. InGaAgP is distinguished from GaAs and GaAlAs, since it has high thermal resistivity. For example, $In_{0.5}(Ga_{0.3}Al_{0.7})_{0.5}P$ has thermal resistivity of 17 K.cm/w, whereas GaAs and $Ga_{0.6}Al_{0.4}As$ have thermal resistivities of 2 K.cm/W and 8 K.cm/W, respectively. Thus, since the cladding layers 11 and 13 are made of InGaAlP, their thicknesses greatly influence the thermal characteristic of the semiconductor laser. The thicker the layer 13, the higher its thermal resistance. In addition, the cladding layer 13, which is a p-type layer, has a high electrical resistance, and heat is generated within the layer 13 when a current flows through the layer 13. The active layer 12, which contacts the cladding layer 13, is inevitably heated to so high a temperature that the threshold current increases too much. In view of the thermal characteristic of the laser, the thinner the cladding layers 11 and 13, the better. However, when the layer 11 or 13 is too thin, the tail of the waveguide reaches the GaAs layer. Part of the optical energy is absorbed by the GaAs substrate 10 and the contact layer 16, and the threshold current density $J_{th}$ increases. As a result, the temperature of the active layer 12 rises.

Therefore, it is desirable that the cladding layers 11 and 13 be as thin as possible, but be thick enough to prevent optical energy from being absorbed into the substrate 10 or the contract layer 16.

It will now be explain what relation the thickness H of the cladding layers 11 and 13 have with the other structural parameters of the semiconductor laser illustrated in FIG. 1.

Figure 3B:
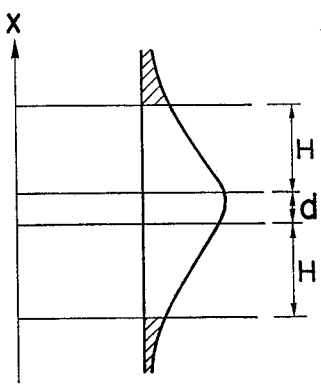

FIG. 3B shows another waveguide which has two layers located on both sides of the three-layer waveguide. Two outer layers act as light-absorbing layer. In the case of this five-layer waveguide, the optical loss $\alpha$ for the waveguide mode due to the light-absorbing layers is given as:

$$\alpha = \Gamma_c' . \alpha_1 \tag{15}$$

where $\alpha_1$ is the optical confinement factor of either layer, amd $\Gamma_c'$ is the optical confinement factor of either layer. $\Gamma_c'$ is approximately:

$$\alpha = \Gamma_c' = \Gamma_c \exp(-2\gamma H) \tag{16}$$

where $\Gamma_c$ is the confinement factor of the cladding layers 11 and 13. and is approximately given as:

$$\Gamma_c = \{2(2k_o^2 . n_a^2 . \Delta - \gamma^2)/\gamma/(2k_o^2 n_a^2 \Delta)\}/(d + 2/\gamma) \tag{17}$$

$\Gamma_c$ is about 1 when $\Delta < 1$, and $d/\lambda < 1$. The optical loss $\alpha$ is determined by $\gamma H$, as can be understood from equations (15) and (16). By virtue of equation (9), $\gamma H$ is represented as:

$$\gamma H = K_o^2 n_a^2 \Delta d H \tag{18}$$

Obviously, the greater the product of $\Delta$, d, and H, the less the (optical) loss $\alpha$. Hence, when d or $\Delta$ is small, H must be reversely great in order to maintain the (optical) loss $\alpha$ at a predetermined value.

Figure 5:
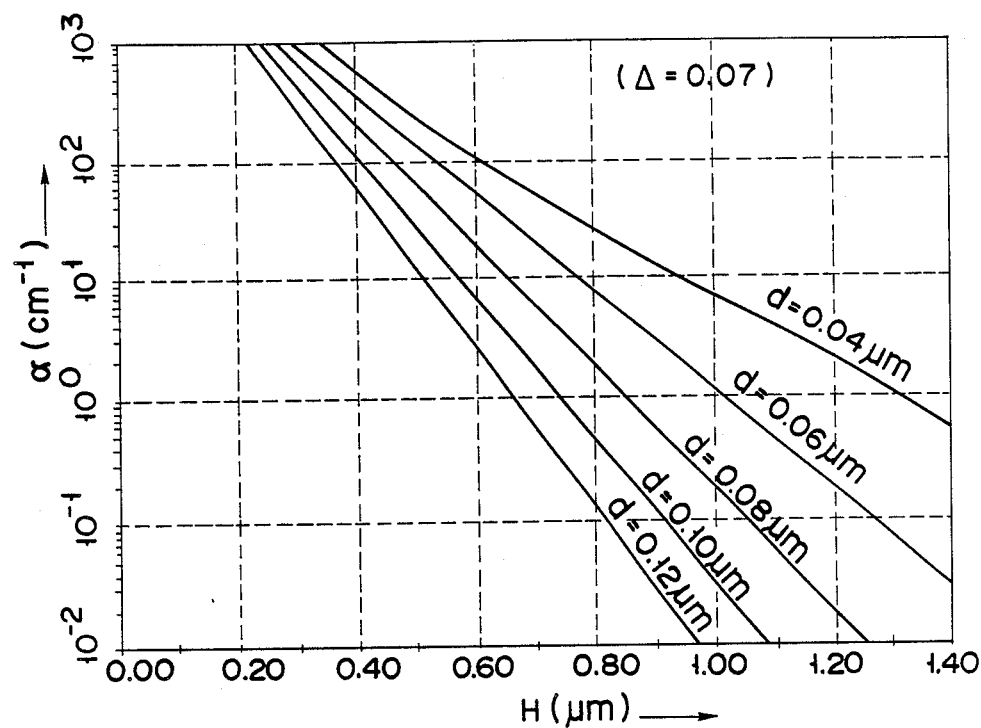
FIG. 5 is a diagram showing how the energy loss $\alpha$ changes with the thickness H of the cladding layer, at various values for the thickness d of the active layer.

FIG. 5 is a diagram prepared by simulating a waveguide model having a complex index of refraction, and represents the relationship between the (optical) loss $\alpha$ and the thickness H of the cladding layers 11 and 13. As is evident from FIG. 5, once a specific value is given for $\alpha$, the thickness H of the cladding layers 11 and 13 in respect to the thickness d of the active layer is determined. It will be discussed what value the (optical) loss $\alpha$ must have not to influence the threshold current of the semiconductor laser. The last term of equation (1), i.e., $(1/L)\ln(1/R)$, is the (optical) loss due to the reflection of light at two facets of the laser. This (optical) loss has the value given below, since L = 300 μm. and R = 34% in the semiconductor laser shown in FIG. 1;

$$(1/L)\ln(1/R) = 36 \text{ cm}^{-1} \tag{19}$$

Apparently, the less the energy loss $\alpha$, the less the threshold current density $J_{th}$ is influenced. Hence, the upper limit of $\alpha$ is set at 20 cm$^{-1}$, or only about half the value of equation (19). When the thickness H of the cladding layers 11 and 13 is selected such that the energy loss $\alpha$ is equal to or less than 20 cm$^{-1}$, the threshold current density $J_{th}$ is not be influenced excessively. Nonetheless, as has been noted, the thermal resistance of the cladding layer 13 rises, inevitably increasing the threshold current, when the layer 13 is too thick. To limit the thickness H, the lower limit of $\alpha$ is set at 1 cm$^{-1}$. This value of 1 cm$^{-1}$ is far less the value specified in equation (19). Thus, the energy loss can be considered to little influence the threshold current of the semiconductor laser. Even if $\alpha$ is set at less than 1 cm$^{-1}$, no advantages will achieved. Therefore, in this embodiment:

$$1 \text{ cm}^{-1} < \alpha < 20 \text{ cm}^{-1} \tag{20}$$

Figure 6:
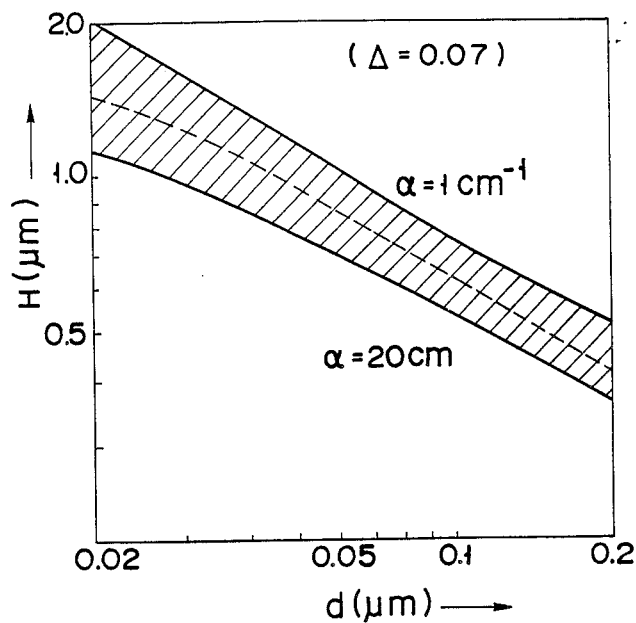
FIG. 6 is a diagram illustrating how the thickness H of the cladding layer changes with the thickness d of the active layer, such that the energy loss $\alpha$ falls within a prescribed range.

FIG. 6 is a diagram representing the relationship between the thickness H of the cladding layers and the thickness d of the active layer 12. More precisely, the upper curve shows the relationship which H and d have when $\alpha$ is 1 cm$^{-1}$, and the lower curve shows the relationship which H and d have when $\alpha$ is 20 cm$^{-1}$. To satisfy equation (20), the thickness H must be in the shaded region defined by the two curves. Both curves shown in FIG. 6, which represent the upper and lower limits of the thickness H, have a slope of approximately $-\frac{1}{2}$ since both d and H are plotted on the logarithmic scales. Hence, as long as o remains unchanged, H and d have the following relationship:

$$H \propto d^{-\frac{1}{2}} \tag{21}$$

Figure 7:
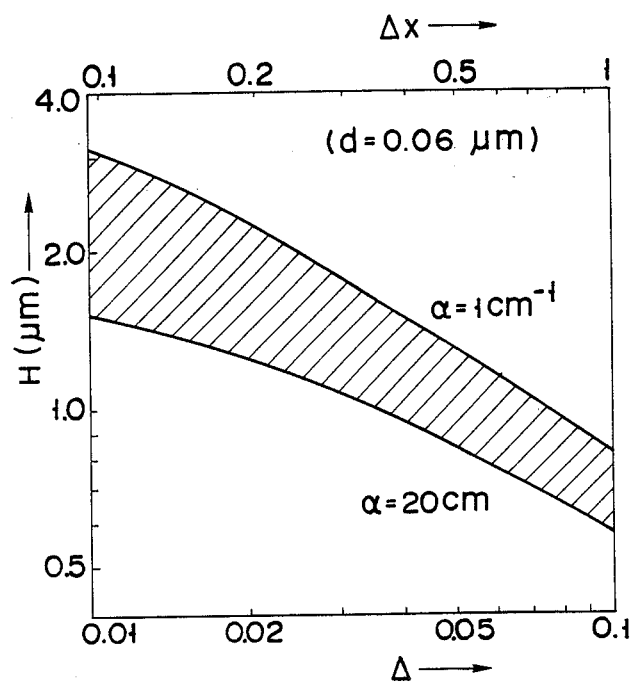
FIG. 7 is a diagram representing how the thickness H of the cladding layer changes with the difference $\Delta$, such that the energy loss $\alpha$ falls within a prescribed range.

FIG. 6 shows the relationship which the thicknesses H and d have when $\Delta$ is constant (=0.07). When the thickness d is constant (=0.06 μm), then H and $\Delta$ will have such a relationship as is illustrated in FIG. 7. The H-$\Delta$ relationship shown in this figure is concerned with the case where the InGaP layer 12 has refractive index $n_a$ of 3.65, and the $In_{0.5}(Ga_{1-x}Al_x)_{0.5}$ layer 11 has refractive index of $n_c$ of (3.65−0.38x). Also plotted in FIG. 7 is the difference $\Delta x$ between the aluminum ratios of the layers 11 or 13 and 12. The two curves shown in FIG. 7, which represent the upper and lower limits of the thickness H, have a slope of approximately $-\frac{1}{2}$. Hence, as long as $\alpha$ remains unchanged, H and $\Delta$ have the following relationship:

$$H \propto \Delta^{-\frac{1}{2}} \tag{22}$$

From equations (21) and (22), the relationship among H, d, and $\Delta$ can be represented as follows:

$$H \propto (\Delta d)^{-\frac{1}{2}} \tag{23}$$

When both H and d are normalized in terms of wavelengths, then the value for H, which satisfies equation (20), can be obtained as follows, from the data shown in FIGS. 6 and 7:

$$0.08(\Delta d/\lambda)^{-\frac{1}{2}} < H/\lambda < 0.12(\Delta d/\lambda)^{-\frac{1}{2}} \tag{24}$$

Hence, when H is set within this range, the semiconductor laser has no optical energy loss due to the energy absorption in the GaAs substrate 10, and the thermal resistance of the cladding layer 13 is reduced to a minimum. For instance, when $\lambda = 0.67$ μm, d = 0.06 μm, and $\Delta=0.07$, the thickness H, which satisfies equation (20), will be:

$$0.68 \text{ μm} < H < 1.0 \text{ μm} \qquad (25)$$

Figure 8:
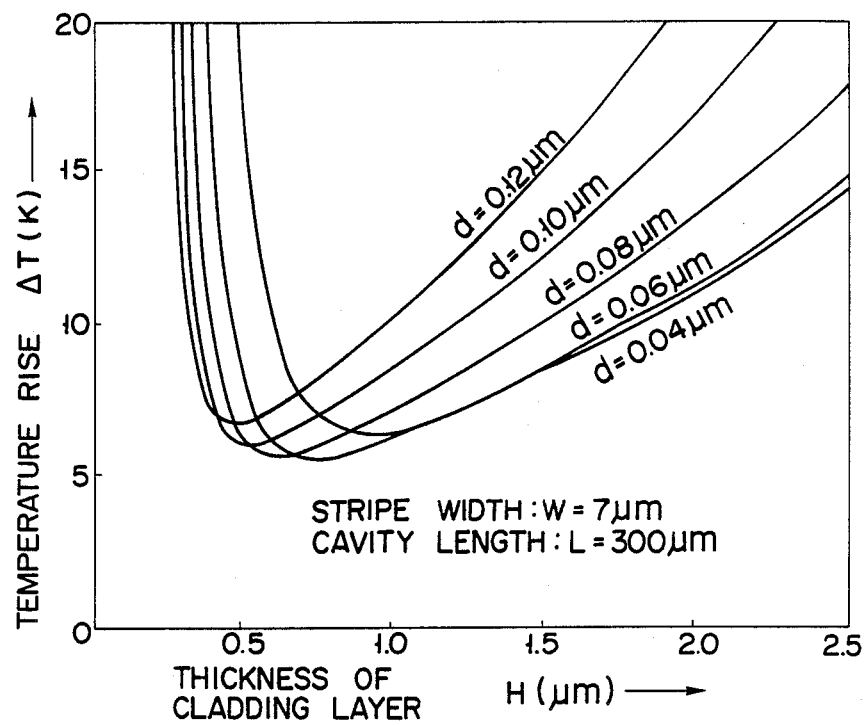
FIG. 8 is a characteristic diagram showing how much the temperature of the active layer changes with the thickness H of the cladding layer, at various values for the thickness d of the active layer.

In order to establish that the range of $\alpha$ defined by equation (20) is reasonable, the temperature rise $\Delta T$ of the active layer 12, and the threshold current $I_{th}$ were calculated by simulating a thermal conduction model. FIGS. 8 and 9 show the dependencies of $\Delta T$ and $I_{th}$ upon the thickness H of the cladding layers 11 and 13. As is evident from these figures, there must be such a specific value of H for each active layer having a different thickness d, as would minimize either $\Delta T$ or $I_{th}$. The relationship which is shown in FIG. 9 and which H and d have to reduce $I_{th}$ to a minimum is indicated by the broken curve shown in FIG. 6. As can be understood from FIG. 6 and FIG. 9, the value of H which would minimize $I_{th}$ is plotted near the middle point of either curve (FIG. 6) representing the relationship which H and d have when $\alpha$ is 1 cm$^{-1}$ or 20 cm$^{-1}$. Hence, the range of $\alpha$ defined by equation (20) is reasonable.

From the broken curve shown in FIG. 6, the value of H which minimizes $I_{th}$ is given as follows:

$$H/\lambda \approx 0.1(\Delta d/\lambda)^{-\frac{1}{2}} \qquad (26)$$

FIG. 9 shows that the threshold current $I_{th}$ is minimal when the cladding layers 11 and 13 have thicknesses H of 0.85 μm. The cladding layers of most conventional GaAlAs lasers have a thickness of 1 μm of more. By contrast, the optimal thickness H of the cladding layer of the InGaAlP laser is slightly less than 1 μm, as has just been discussed. Hence, according to the present invention, the thickness of the cladding layers 11 and 13 is 1 μm or less. From equations (13) and (26), the relationship between H and $\neq$ can be represented as follows:

$$H/\lambda \approx 0.67\Delta^{-\frac{1}{2}} \qquad (27)$$

The above description in limited to the cases where the cladding layers 11 and 13 have the same aluminum ratio. When the layers 11 and 13 have different aluminum ratios, more particularly when the layer 11 is made of $In_{0.5}(Ga_{1-x}Al_x)_{0.5}P$ having refractive index of $\eta_{cl}$, and the layer 13 is made of $In_{0.5}(Ga_{1-z}Al_z)_{0.5}P$ having refractive index of $\eta_{c2}$, $\Gamma_a$ defined by the equation (10) will be approximated as follows:

$$\Gamma_a = k_o^2 n_a^2 \Delta' d^2 \qquad (10')$$

where $$\Delta' = \{(\Delta_l + \Delta_2)/2\}\{1 + (\Delta_1 + 2)^2/(4\Delta_1\Delta_2)\}/2$$

$$\Delta_1 = (n_a^2 - n_{cl}^2)/(2n_a^2)$$

$$\Delta_2 = (n_a^2 - n_{c2}^2)/(2n_a^2)$$

When the difference between $\eta_{c1}$ and $\eta_{c2}$ is small, $\Delta'$ can be approximated to be the average value for $\Delta_1$ and $\Delta_2$. Namely:

$$\Delta' \approx (\Delta_1 + \Delta_2)/2$$

In this case, it suffice to substitute $\Delta'$ for $\Delta$ in formulae (11) to (14). The inequality (24) can be replaced by the following inequalities which define the thickness $H_1$ of the cladding layer 11 and the thickness $H_2$ of the cladding layer 13;

$$0.08(\Delta_1 d/\lambda)^{-\frac{1}{2}} < H_1/\lambda < 0.12(\Delta_1 d/\lambda)^{-\frac{1}{2}}$$

and $$0.08(\Delta_2 d/\lambda)^{-\frac{1}{2}} < H_2/\lambda < 0.12(\Delta_2 d/\lambda)^{-\frac{1}{2}}.$$

As has been explained, the threshold current of the InGaAlP semiconductor laser can be reduced sufficiently when the active layer has the thickness d specified by equation (14), more specifically by equation (13). Further, the rise of the temperature of the active layer can be minimized, and the laser can thus operate reliably, when the cladding layer has the thickness H given by equation (24), more specifically by equation (26). These have been ascertained by the results of the test performed on the devices actually made and identical to the embodiment shown in FIG. 1.

The present invention is not limited to the embodiment described above. For example, the materials of the double-hetero structure need not be InGaP and $In_{0.5}$-$(Ga_{0.3}Al_{0.7})_{0.5}P$. It suffices that the active layer 12 and the cladding layers 11 and 13 are made of $In(Ga_{1-y}Al_y)P$ and $In(Ga_{1-x}Al_x)P$, respectively, where $0 \leq y \leq x \leq 1$. Further, the double-hetero structure need not be limited to an inner stripe one shown in FIG. 1; it can be any gain-guiding structure or indexguiding structure. Still further, the material of the cladding layer, whose thickness H must be optimized, need not be InGaAlP. Any other material can be used that enables either the substrate or the contact layer to absorb energy. Moreover, various changes and modifications can be made, without departing the spirit of the present invention.

As has been described in detail, the present invention can provide an InGaAlP semiconductor laser which has small threshold current, excellent thermal characteristics, and high reliability.

A semiconductor laser according to a second embodiment of the present invention will now be described, with reference to FIG. 10 through FIG. 27.

FIG. 10 is a sectional view schematically showing the second embodiment of the invention. In this figure, the same reference numerals designate the same components as those of the first embodiment shown in FIG. 1. An n-type cladding layer 11 is formed on a substrate 10. The aluminum ratio x of this cladding layer 11 or 13 is 0.7. An active layer 12 is formed on the cladding layer 11, and has a thickness d of 0.06 μm. A p-type cladding layer 13 is formed on the active layer 12. This cladding layer 13 has a ridge-shaped portion 19. A light-confining layer 15 is formed on the entire supper surface of the cladding layer 13, except for the ridgeshaped portion 19. The distance ho between the active layer 12 and the light-confining layer 15 is 0.2 μm. The ridge 19 has a width W of 5 μm at the base. The n-type cladding layer 11 has a thickness $H_1$ of 0.8 μm. The portion 19 of the p-type cladding layer 13 has the same thickness $H_2$ of 0.8 μm.

Also in this laser, the n-GaAs light-confining layer 15 is located close to the active layer 12, and absorbs the light emitted from the active layer 12 in the region outside the ridge. As a result, the double-hetero structure at the ridge-shaped portion 19 and that at outer portions have different effective complex indices of refraction. Due to the difference in complex refractive indexes, the light confined in the stripe section in the horizontal direction. The light-confining layer 15 performs the same function as the current-restriction layer 15 used in the laser illustrated in FIG. 1. More precisely, an electric current flows in only the ridge-shaped portion 19 due to the existence of the layer 15. Therefore, the laser has a small threshold current.

The semiconductor laser of the second embodiment (FIG. 10) is designed to control the transverse mode, and it cannot accomplish a stable transverse-mode oscillation, with astigmatism limited as much as possible, unless it has optimal structural parameters. The parameters specified above are nothing more than a few examples. The best possible structural parameters of this laser will now be discussed.

The characteristic of a semiconductor laser, which must be first taken into consideration, is its threshold current for oscillation. This value is determined, almost singly by the density of the threshold current in the double-hetero structure which is the main section of the laser. In the case of a transverse-mode stabilized laser, the threshold current value is determined by not only the threshold-current density, but also the waveguide-mode energy loss.

Figure 12:
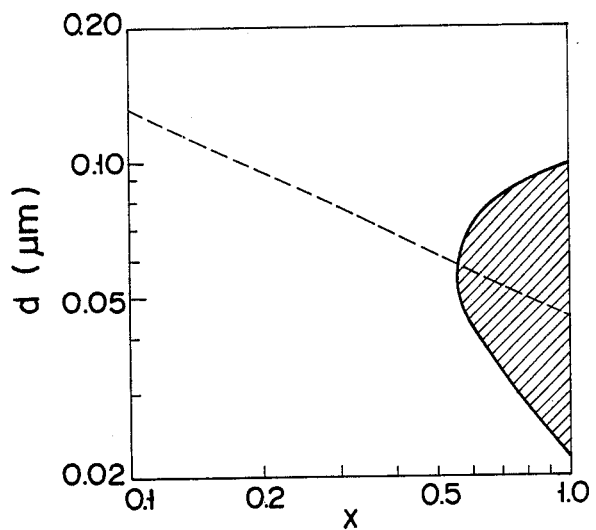
FIG. 12 is a characteristic diagram showing how the thickness d of the active layer should be determined in accordance with the aluminum ratio of the active layer, thereby to minimize the density $J_{th}$ of the threshold-current density $J_{th}$.

As can be understood from FIG. 10, the InGaP active layer 12, the n-type, $In_{0.5}(Ga_{l-x}Al_x)_{0.5}P$ cladding layer 11, and the p-type $In_{0.5}(Ga_{l-x}Al_x)_{0.5}P$ cladding layer 13 constitute a double-hetero structure. Like FIG. 2, FIG. 11 shows the dependency of the threshold-current density $J_{th}$ in the double-hetero structure upon the thickness d of the active layer 12, at various aluminum ratios x of the cladding layers 11 and 13. As is evident from FIG. 11, there is an optimal value for the thickness d of the active layer 12, which minimizes $J_{th}$ at a given aluminum ratio. The broken line shown in FIG. 12 represents the relationship between the thickness d which minimize the density $J_{th}$, and the aluminum ratio x. In FIG. 12, the shaded region indicates the range for the thickness d, within which $J_{th}$ is 2 kA/cm² or less. The diagram of FIG. 12 applies to the case where the active layer 12 is made of InGaP. Nonetheless, it can apply to the case where the layer 12 is made of $In_{0.5}(Ga_{l-y}Al_y)_{0.5}P$. In this case, what is plotted on the horizontal shaft is the difference Δx between the aluminum ratio x of the cladding layer 11 and the aluminum ratio y of the active layer 12. As is clear from FIG. 11, the density $J_{th}$ sharply increases in inverse proportion to the aluminum ratio x or the difference Δx.

The greater the aluminum ratio x, the better, in view of the reduction of the threshold-current density. However, when the aluminum ratio x is great, the difference between the refractive index of the cladding layer 11 or 13 and that of the active layer 12 proportionally increases. Consequently, the cladding layers 11 and 13 confines light within the active layer 12 to a greater degree, and the beam-diverging angle increases so much that the laser can no longer be practical.

Figure 13:
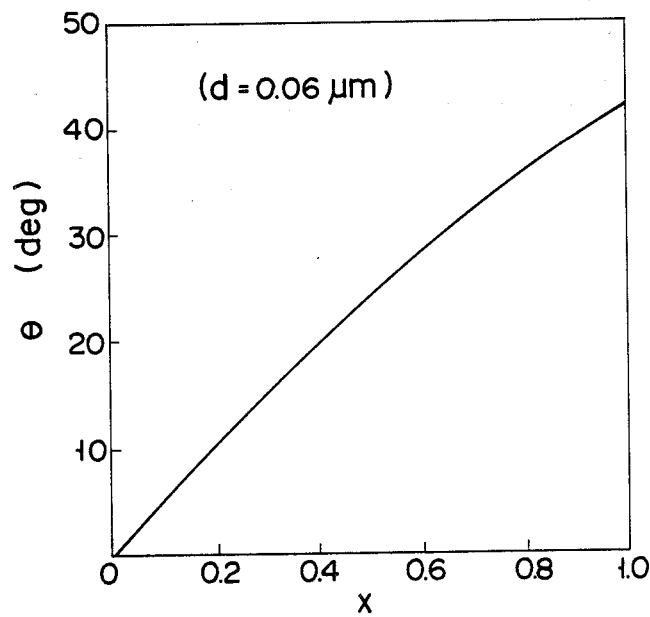
FIG. 13 is a diagram showing the calculated dependency of the beam-diverging angle upon the aluminum ratio of the cladding layer, which may be observed with the semiconductor laser shown in FIG. 10.

FIG. 13 is a diagram representing the relationship which the beam-diverging angle $\theta\perp$ and the aluminum ratio x have when the active layer 12 is 0.06 μm thick. As can be understood from FIG. 13, the beam-diverging angle $\theta\perp$ is substantially proportionate to the aluminum ratio x. A lens having a large NA (Numerical of Aperture) is required to collimate the beam emitted from a semiconductor laser and diverging at a great angle. Generally, it is difficult to use a lens having a large NA. In particular, a lens having an NA greater than 0.3 is difficult to adjust, and also gives rise to astigmatism. Further, such a lens is expensive, and an optical system including this lens is also expensive. NA of 0.3 is equivalent to a beam-diverging angle of 35°, i.e., 2 $\sin^{-1}(0.3)$. Hence, to use a lens whose NA is 0.3 or less, the beam-diverging angle $\theta\perp$ must be 35° or less. From FIG. 13 it is evident that the aluminum ratio x must be 0.8 or less to prevent the beam-diverging angle $\theta\perp$ from increasing over 35°.

It is obvious from FIGS. 12 and 13 that $J_{th} \leq 2$ kA/cm², and $\theta\perp \leq 35°$. The ranges for x and d are:

$$0.55 \leq x \leq 0.8 \qquad (28)$$

$$0.02 \ \mu m \leq d \leq 0.1 \ \mu m \qquad (29)$$

These are the results of a simulation analysis. These ranges for x and d must be narrower in practice, because of various problems such as the limited doping level of the cladding layer, the fall of the characteristic temperature due to carrier overflow, and the fall of the maximum oscillation temperature.

Figure 14:
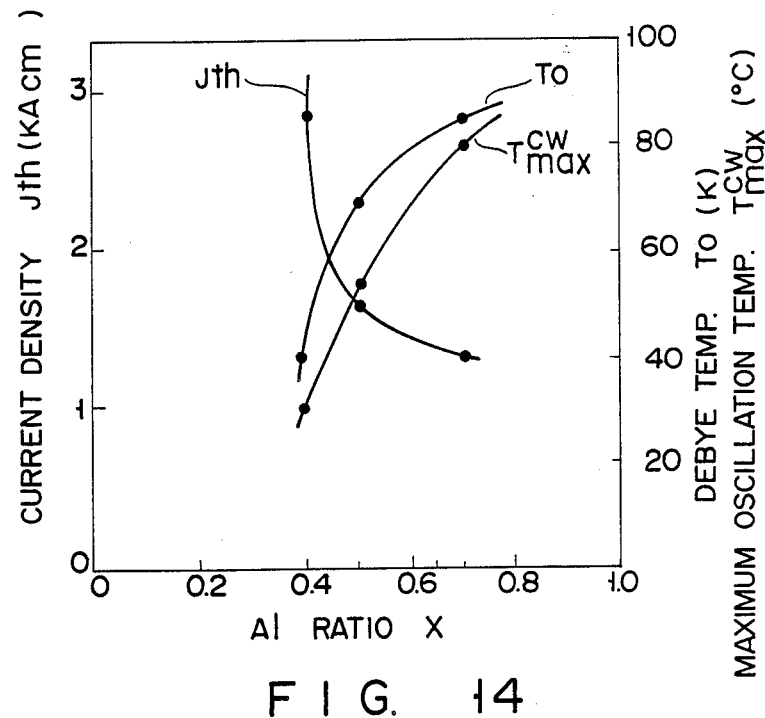
FIG. 14 is a diagram prepared based on experiments and representing how the aluminum ratio of the cladding layer used in the laser shown in FIG. 10 influences the current density in the active layer, the temperature of the active layer, and the maximum temperature the active layer can have while continuously emitting a beam.

FIG. 14 is a diagram prepared based on the results of experiments, and representing how the thresholdcurrent density $J_{th}$, the characteristic temperature $T_o$, and the maximum oscillation temperature $T_{max}$ depend upon the aluminum ratio x of the cladding layers 11 and 13.

As is evident from FIG. 14, the threshold-current density $J_{th}$ is too high, about 3 kA/cm² when the aluminum ratio x is 0.4. Even when x is 0.5, $J_{th}$ is still high, i.e., 1.8 kA/cm². However, when x is 0.7, $J_{th}$ is reduced to 1.3 kA cm². Therefore, the aluminum ratio x should better be 0.7, rather than 0.4 to 0.5.

Also, as is clear from FIG. 14, the characteristic temperature $T_o$ increases with the aluminum ratio x. When x increases from 0.5 to 0.7, the characteristic temperature $T_o$ rises from 70K to 85K, and the maximum oscillation temperature $T_{max}^{cw}$ also rises about 20° C. The temperature $T_{max}^{cw}$ is one of the operation characteristics of a semiconductor laser. The higher the temperature $T_{max}^{cw}$, better The test of InGaAlP semiconductor lasers, which the inventors hereof have carried out, showed that, when the lasers were operated at 50° C., they failed to emit stable beams unless $T_{max}^{cw}$ was at least 70° C. Tmax is less than 70° C. when the aluminum ratio x is less than 0.6, as can be understood from FIG. 14.

Figure 15:
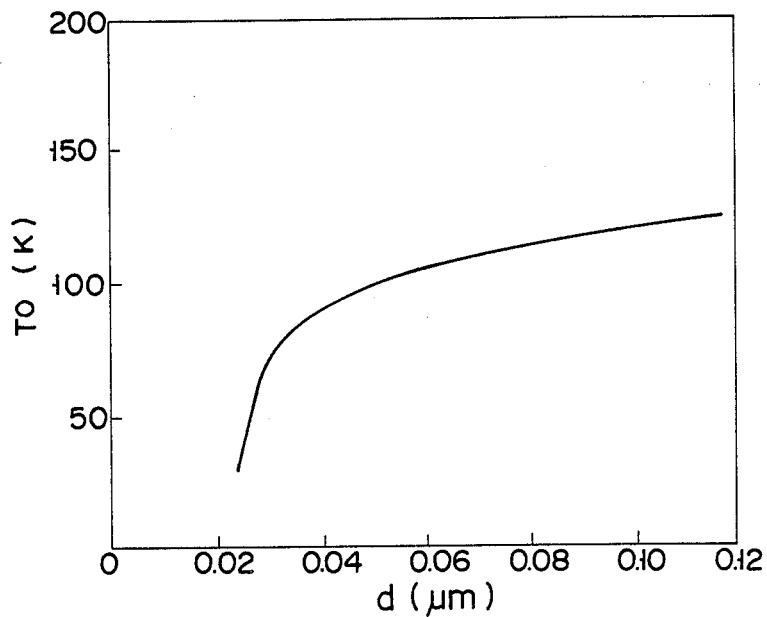
FIG. 15 is a diagram prepared based on experiments and illustrating how the temperature of the active layer used in the layer shown in FIG. 10 depends upon the thickness of the active layer.

Hence, when the aluminum ratio x of the cladding layer 11 or 13 is 0.65 or more, not only the thresholdcurrent density $J_{th}$ is sufficiently low, but also the laser can continuously emit a stable beam. FIG. 15 is a diagram also prepared based on the results of experiments, and representing the dependency of the characteristic temperature $T_o$ upon the thickness d of the active layer 12. As this diagram shows, the temperature $T_o$ was very low when the thickness d was less than 0.03 μm. The results of the experiments revealed that the maximum oscillation temperature $T_{max}^{cw}$ was too low when the thickness d was less than 0.03 μm. The results of the experiments and equations (28) and (29) suggest that the laser has a sufficiently small threshold current and excellent thermal characteristics when the aluminum ratio x of the cladding layers 11 and 13 and the thickness d of the active layer 12 fall within the following ranges:

$$0.65 \leq x \leq 0.8 \tag{30}$$

$$0.03 \ \mu m \leq d \leq 0.1 \ \mu m \tag{31}$$

The relationship between the aluminum ratio x and the p-type carrier concentration in the p-type cladding layer 13 will be briefly discussed. Either Zn or Mg can be used as the p-type dopant. Through experiments it has been found that, when Mg is used, it is difficult to control the forming of a PN junction. Therefore, Zn is used in the presenting invention. The experiments conducted by the inventors showed that, when the aluminum ratio x was 0.8, the p-type carrier concentration was only $1 \times 10^{17}$ cm$^{-3}$, and both the characteristic temperature $T_o$ and the maximum oscillation temperature $T_{max}^{cw}$ fell too low. When the aluminum ratio x was 0.75, the p-type carrier concentration increased to $2 \times 10^{17}$ cm$^{-3}$, and the characteristic temperature rose to 90K. Hence, in the present invention, when Zn is used as the dopant in the p-type cladding layer 13, the aluminum ratio x is 0.75 or less.

The structural parameters, which enable the semiconductor laser shown in FIG. 10 to operate in a stable fundamental transverse mode will be discussed. To confine light propagating in the semiconductor laser, it is required that the effective refractive index varies in the horizontal direction. This variation of the refractive index must be great enough to compensate for the variation of the refractive index, which has resulted from the plasma effect accompanying the carrier injection. In the case of a GaAlAs semiconductor laser or an InGaAsP semiconductor laser, the variation of the refractive index, resulting from the plasma effect, is in the order of $10^{-3}$. It can be assumed that the refractive index varies by a similar value also in an InGaAlP semiconductor laser. When the change, or difference ΔN, of the ffective refractive index is less than $10^{-3}$, the effect of the gain-guiding becomes redominant, and the phase of the beam wave is delayed due to the gain distribution of the waveguide. Because of the phase delay, the waist of the beam being emitted from the laser deviates greatly from the beam-emitting facet of the laser In other words, the astigmatism becomes prominent.

Figure 16:
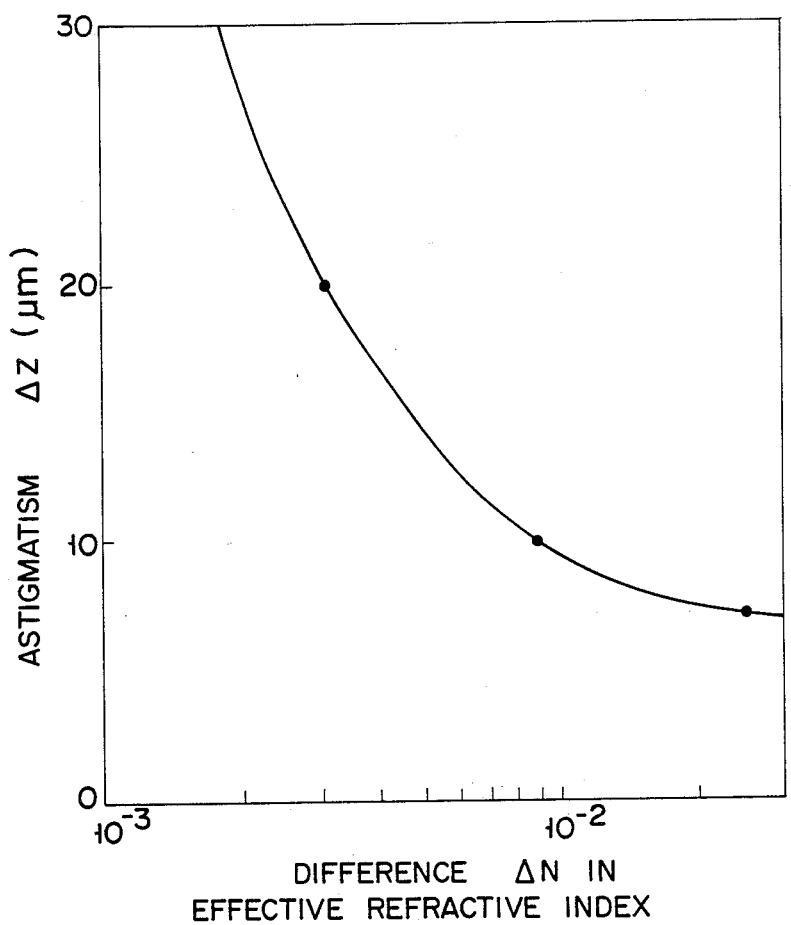
FIG. 16 is a diagram also prepared based on experiments and showing the dependency of astigmatism upon the difference Δ of the effective refractive index of the cladding layer.

FIG. 16 is a diagram representing the relationship between astigmatism Δz and the difference ΔN of effective refractive index, which was observed in a semiconductor laser having a stripe width W of 5 μm. As is evident from FIG. 16, the astigmatism Δz drastically increases in reverse proportion to the difference ΔN. This semiconductor laser operated almost in the same way as a gain-guiding type, in the region where ΔN is less than $\times 10^{-3}$. Therefore, the difference ΔN of effective refractive index must be $2 \times 10^{-3}$ or more, so that the propagating light wave is confined in the horizontal direction. When the difference ΔN was $5 \times 10^{-3}$ or more, the light was more effectively confined, reducing the astigmatism Δz to 15 μm or less.

In the semiconductor laser shown in FIG. 10, ΔN is the difference in effective refractive index between the ridge-shaped portion 19 and the other portions. The effective refractive index of the other portions greatly depends on the distance ho between the active layer 12 and the light-confining GaAs layer 15.

Figure 17:
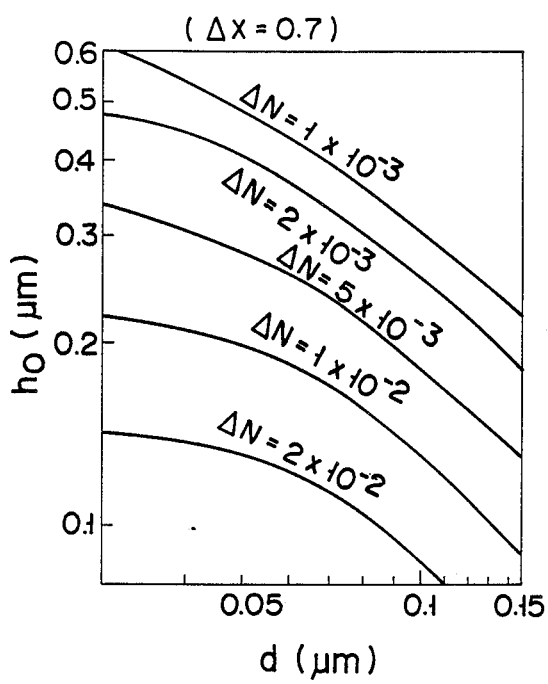
FIG. 17 is a diagram showing the estimated relationship which the thickness d of the active layer and the distance ho between the active layer and the beam-shielding layer having in the laser of FIG. 10 at various values for ΔN.
Figure 18:
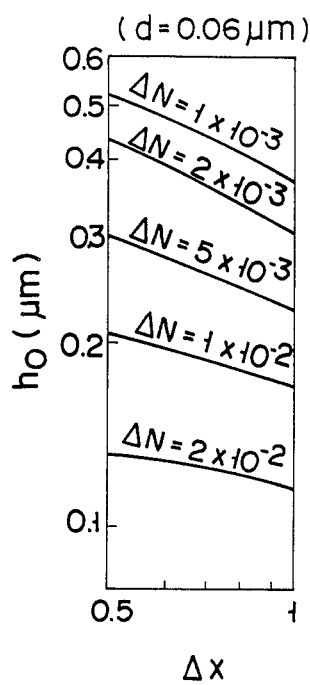
FIG. 18 is a diagram representing the estimated relationship which the distance $h_o$ and Δx have in the laser of FIG. 10 at various values for ΔN.

FIG. 17 shows the estimated relationship which the thickness d of the layer 12 and the distance $h_o$ have at various values for ΔN. As is understood from this figure, ΔN decreases in inverse proportion to the thickness d and the distance ho. The relationship which the thickness d and the distance ho have at a given value of ΔN is represented as: $h_o \propto d^{-1}$ FIG. 18 represents the estimated relationship which the distance $h_o$ and the difference Δx in aluminum ratio x have at various values for ΔN. As is evident from FIG. 18, the relationship between the distance $h_o$ and difference Δx, at a given value of ΔN, is represented as: $h_o \propto \Delta x^{-178}$.

When the distance $h_o$ and the thickness d are normalized in terms of the oscillation wavelength λ, the distance $h_o$ which renders ΔN constant, the thickness d, and the difference Δx will have the following relationship:

$$h_o/\lambda \propto (\Delta x d/\lambda)^{-1} \tag{32}$$

When $\Delta N \leq 2 \times 10^{-3}$, the following can be obtained from FIGS. 17 and 18:

$$h_o/\lambda \leq 0.13 \ (\Delta x d/\lambda)^{-1} \tag{33}$$

When $\Delta N \leq 5 \times 10^{-3}$, the following can be obtained from FIGS. 17 and 18:

$$h_o/\lambda 0.09 \ (\Delta x d/\lambda)^{-178} \tag{34}$$

The distance $h_o$ must satisfy inequality (33) even if the refractive index changes due to the plasma effect, in order to prevent the laser from performing a gain-guiding type. To enable the laser to achieve the advantages possible with index-guiding structure, it suffices that the distance $h_o$ satisfies inequality (34). For instance, when $\lambda = 0.67$ μm, Δx = 0.7, and d = 0.06 μm, the distance $h_o$ will have the following values to satisfy inequality (33) and inequality (34):

$$h_o \leq 0.35 \ \mu m \tag{35}$$

$$h_o \leq 0.24 \ \mu m \tag{36}$$

Theoretically, the lower limit of the distance $h_o$ is 0. In practice, however, the distance $h_o$ cannot be 0. When $h_o$ is nearly equal to 0, the current cannot be sufficiently blocked in the portions outside of the ridge-shaped portion. Consequently, a leakage current flows, impairing the current-voltage characteristic of the semiconductor laser.

According to the results of the experiments conducted by the inventors, a leakage current flowed when the distance $h_o$ was less than 0.1 μm. Hence, the distance $h_o$ should be 0.1 μm or more, in order to prevent such a leakage current.

Figure 19:
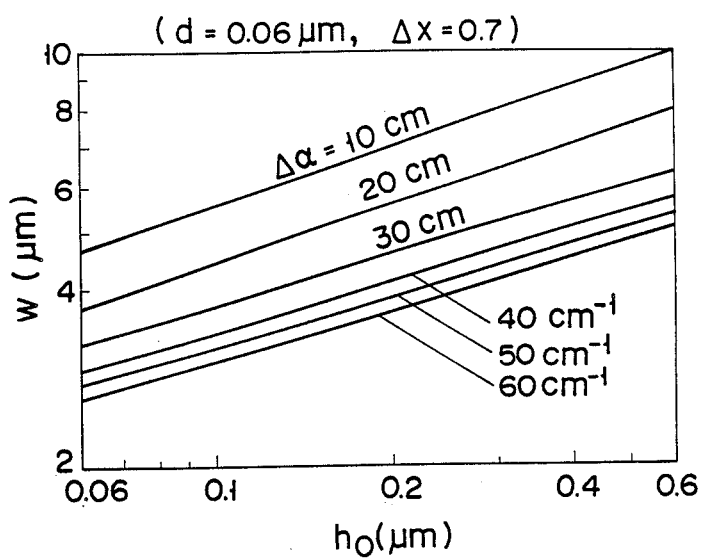
FIG. 19 is a diagram showing the estimated relationship which ho and the width W of the stripe have in the laser shown in FIG. 10 at various values for the difference Δα of mode loss.

The relationship between the stripe width W and the transverse mode will now be discussed. As has been described, the degree of light confinement greatly depends on ΔN which is determined by $h_o$, d, and Δx. Inequalities (33) and (34) give the lower limits of ΔN. when ΔN is too great, the laser is likely to perform a high-order mode oscillation, depending on the stripe width W. Since the laser shown in FIG. 10 is of loss-guiding type, it does not perform a high-order mode oscillation even if there exists a solution to the high-order mode, as long as the laser is supplied with a current which nearly equal to the threshold value. This is because the gain of the fundamental mode oscillation is greater than that of the high-order mode one, at the current nearly equal to the threshold value. When the current supplied to the laser increases above the threshold value, the gain of the high-order mode oscillation and the loss thereof balance. If this is the case, the laser performs the high-order mode oscillation. The smaller the difference between the loss of the high-order mode oscillation and that of the fundamental mode oscillation, both performed at the threshold current, the more probably the laser performs the high-order mode oscillation in a low power region. FIG. 19 shows the estimated relationship which $h_o$ and W have in the laser (FIG. 10) at various values for the difference Δα between the loss of the first mode oscillation and that of the fundamental mode oscillation. Both $h_o$ and W are plotted on the logarithmic scales, and the lines showing the $h_o$-W relationships at different values for Aυ have a slope of approximately $-\frac{1}{3}$. Thus, as long as Δα remains unchanged, $h_o$ and W have the following relationship:

$$W \propto h_o^{\frac{1}{3}} \quad (37)$$

This difference Δα can be determined largely by the difference ΔN of effective refractive indices and the stripe width W of the ridge portion 19. Hence, the difference Δα is considered to depend upon the other parameters, i.e., the thickness d and the difference Δx of aluminum ratios, just in the same way as the difference AN does. From the relationship (32). AN can be represented as a function of $[(h_o/\lambda)(\Delta xd/\lambda)^{\frac{1}{2}}]$. Hence, when the relationship (37) is taken into account, W, $h_o$, d, and Δx should have the following relationship to render Δα constant:

$$W/\lambda \propto [(h_o/\lambda)(\Delta xd/\lambda)^{\frac{1}{2}}]^{\frac{1}{3}} \quad (38)$$

Here, let the difference Δα, which is required to achieve a stable, fundamental mode oscillation, be set at 20 cm¹. This value is equivalent to half the cavity loss (1/L)·n(1/R) resulting from the reflection of the beam at the laser facets. If the difference has this value when the current supplied to the laser is 1.5 times of the threshold value $I_{th}$, the high-order mode oscillation can be suppressed.

From the relationship (38), we can determine, as follows, the range within which the stripe width W should fall to render the difference Δα equal to or more than 20 cm¹.

$$W/\lambda 20[(h_o/\lambda)(\Delta xd\lambda)^{1/8}]^{\frac{1}{3}} \quad (39)$$

For instance, when λ=0.67 μm, Δx=0.7,=0.06 μm, and h=0.2 m, the width W will have the following value to satisfy the relationship (39):

$$W \leq 5.6 \ \mu m \quad (40)$$

Figure 20:
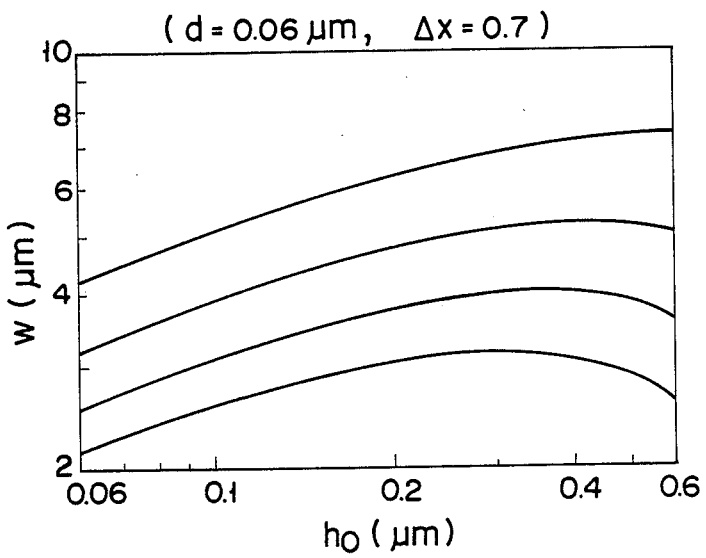
FIG. 20 is a diagram showing the estimated relationship which ho and the width W of the stripe have in the laser shown in FIG. 10 at various values for the difference α₀ of fundamental mode loss.

FIG. 20 represents how the fundamental mode loss $\alpha_0$ depends on W and $h_o$, when d=0.06 μm, and Δx=0.7. As is evident from FIG. 20, unless the width W satisfies the relationship (39), and thus is not too small, the loss of the fundamental mode oscillation is far less than the cavity loss, and an increase of the threshold current makes no problem. When the mode loss which would affect the threshold current is set to be 20 cm¹, approximately half the reflection loss at the laser facets, the range within which W should fall to satisfy $\alpha_0 \leq 20$ m¹ is given as follows:

$$W/\lambda \leq 13[(h_o/\lambda)\Delta xd/\lambda)^{\frac{1}{2}}]^{\frac{1}{3}} \quad (41)$$

When λ=0.67 μm, Δx=0.7, d=0.6 m, and h=0.2 m, the width W will have the following value to satisfy the relationship (41):

$$W \geq 3.7 \ \mu m \quad (42)$$

The above discussion is based on the results of the simulation performed on a model identical in structure to the laser of FIG. 10, wherein the thickness $H_1$ of the n-type cladding layer and the thickness $H_2$ of the p-type cladding layer are indefinitely large.

Thermal characteristics are also important to semiconductor laser. Of the thermal characteristics, the thermal resistance of the laser, which depends on the thickness the cladding layers, is particularly important as described-above with reference to FIG. 1. The optimum range of thickness H is given by equation (24) is consideration of the thermal resistance.

The inequality (24) can be modified with reference to the equation (4) to follows.

$$0.25(\Delta xd/\lambda)^{-\frac{1}{2}} \leq H/\lambda \leq 0.38(\Delta xd/\lambda)^{\frac{1}{2}} \quad (43)$$

FIG. 6 shows the ranges in which d and H fall when the n-type cladding layer 11 and the p-type cladding layer 13 have the same aluminum ratio, that is, when $\Delta x_1 = \Delta x_2 = \Delta x$. When the cladding layers 11 and 13 have different aluminum ratios, x and z ($\Delta x_1 = x-y$, $\Delta x_2 = z-y$). In this case, it suffices to set the thickness Hl of the layer 11 and the thickness $H_2$ of the layer 13 within the following ranges:

$$0.25(\Delta x_1 d/\lambda)^{-\frac{1}{2}} \leq H_1/\lambda \leq 0.38(\Delta x_1 d/\lambda)^{-\frac{1}{2}} \quad (44)$$

$$0.25(\Delta x_2 d/\lambda)^{-\frac{1}{2}} \leq H_2/\lambda \leq 0.38(\Delta x_2 d/\lambda)^{-\frac{1}{2}} \quad (45)$$

For example, when λ=0.67 μm, $\Delta x_1 = \Delta x_2 = 0.7$, and d=0.06 μm, the thicknesses $H_1$ and $H_2$ should have the following values;

$$0.67 \ \mu m \leq H_1, H_2 \leq 1.0 \ \mu m \quad (46)$$

FIG. 21 illustrates a modification of the semiconductor laser shown in FIG. 10. As can be understood from FIG. 21, this modification is identical to the laser of FIG. 10 in structure, except for the cross-sectional shape of the ridge portion 24. The ridge portion has a different shape because the direction, in which the stripe extends, is different. More specifically, the stripe extends in <011> direction, whereas the strip of the laser of FIG. 10 extends in <011>. Also in the modification, the width of the bottom of the ridge 24 is defined as the stripe width W. This is because the effective refractive index with respect to the vertical direction greatly changes in accordance with the distance ho between the active layer 22 and the GaAs light-shielding layer 25. The farther the GaAs layer 25 is located from the active layer 22, the closer the effective refractive index to the value in the center portion of the ridge portion 24. Hence, any portion of the cladding layer 23 that is thicker than the distance $h_o$ can be regarded as a ridge portion. The discussion made on the laser shown in FIG. 10 can, therefore, apply to the modification illustrated in FIG. 21.

The cross-sectional shape of the ridge is not limited to those shown in FIGS. 10 and 23. The ridge portion of the P-type cladding layer can have a different cross-sectional shape.

FIG. 22 illustrates another modification of the semiconductor laser shown in FIG. 10. This modification differs from the laser (FIG. 10) only in that the p-type cladding layer consists of three layers. More precisely, the p-type cladding layer is formed of a second layer 33 made of p-type $In0.5(Ga_{1-z}Al_z)0.5$, a third layer 34 made of p-type $In0.5(Ga_{1-u}Al_u)0.5$, and the fourth layer 35 made of p-type $In0.5(Ga_{1-s}Al_s)0.5$. The aluminum ratio u of the third layer 34 is less than those z and s of the second and fourth layer 33 and 35, that is, $0 \leq u < z, s$. The third layer 34 is used as an etching stopper during the chemical etching for forming the ridge portion. Since $u < s$, the etching speed of $In0.5(Ga_{1-u}Al_u)0.5$ is relatively low, and the etching of the $In0S(Ga_{1-u}Al_u)0.5$ layer is stopped at the distance $h_o$ from the active layer 32.

Since the third layer 34 has an aluminum ratio u less than those z and s of the second and fourth layers 33 and 35, its thickness t is important. Because of the difference in aluminum ratio, the third layer 34 has a refractive index different from those of the first and third layers 33 and 35. Further, when the aluminum ratio u of the third layer 34 is less than that of the active layer 32, it will act as light-absorbing layer. Therefore, when the third layer 34 is too thick, it will adversely influence the transverse mode oscillation and the threshold current of the laser. When the third layer 34 is too thin, it can no longer function as an etching stopper. Hence, the third layer 34 must be thick enough to function as an etching stopper, and also thin enough not to affect the transverse mode oscillation or the threshold current of the laser. The results of the experiments conducted by the inventors hereof show that when the thickness t of the third layer 34 was 40 Å or less, it was impossible, in some cases, to control correctly the distance $h_o$ due to the differences in surface condition among the wafers. On the other hand, when the thickness t was 45 Å or more, the distance $h_o$ could be controlled correctly. Therefore, according to this invention, the lower limit of the thickness t is set at 45 Å. To determine the upper limit of thickness t, it should be studied how the thickness t influences the threshold current, the energy loss in the fundamental mode oscillation, and the difference in energy loss between the fundamental mode oscillation and the first-order mode oscillation.

FIG. 23 is a diagram prepared based on simulation results and showing how the energy loss $\alpha$ in the fundamental mode oscillation, and the difference $\Delta\alpha$ in energy loss between the fundamental mode oscillation and the first-order mode oscillation depend upon the thickness t of the third layer 34, when $\lambda=0.67$ μm. $\Delta x=0.7$, d=0.06 μm, and $h_o=0.2$ μm, and W =5 μm. FIG. 24 is also a diagram prepared based on simulation results and representing how the threshold current Ith depends on the thickness t when $\lambda 0.67$ μm. $\Delta x=0.7$, d=0.06 μm, and h=0.2 μm, and W=5 μm. As is evident from FIGS. 25 and 26, when thickness t is more than 200 Å, the difference $\Delta\alpha$ decreases to 20 cm$^{-1}$ or less, and both the loss and the threshold current It increase. Therefore, according to the present invention, the thickness t of the third layer 34 is set to fall within the following range:

$$45 \text{ Å} \leq t \leq 200 \text{ Å} \tag{47}$$

As long its thickness t falls within this range, the layer 34 least influences the guidewave mode oscillation is least influenced, and can function as effective etching stopper.

Still another modification of the semiconductor laser shown in FIG. 10 will be described, with reference to FIG. 25. As is illustrated in FIG. 25, this modification comprises an n-type GaAs substrate 50, a first cladding layer 51 formed on the substrate 50 and made of n-type $In0.5(Ga_{0.3}Al_{0.7})_{0.5}P$, an active layer 52 formed on the first cladding layer 51 and made of undoped InGaP, a second cladding layer 53 formed on the active layer 52 and made of p-type $In0.5(Ga_{0.3}Al_{0.7})_{0.5}P$, an p-type InGaP cap layer 54 formed on the second cladding layer 53, a p-type light-confining layer 55 formed on the cap layer 54, an n-type electrode 56 formed on the layer 55, and a p-type electrode 57 formed on the lower surface of the substrate 50. The p-type light-confining layer 55 functions as a current-restricting layer and a contact layer. Namely, no current flows through that portion of the layer 55 which contact the flat portion of the second cladding layer 53, because of the potential barrier defined by the discontinuity of valence band existing between the p-type layer 53 and the p-type layer 55. By contrast, a current flows through that portion of the layer 55 which contacts the ridge portion of the layer 53, because of the cap layer 54 which is interposed between the p-type layer 53 and the p-type layer 55 and which has an intermediate band gap. (See Conf., Applied Physics, Autumn 1984, 19a-ZR-6.) The modification shown in FIG. 27 is easier to manufacture than the laser illustrated in FIG. 10 and the modifications thereof shown in FIGS. 23 and 24, respectively, since it suffices to perform regrowth of crystals only once after the ridge portion of the second cladding layer 53 has been formed, as is detailed in U.S. Ser. No. 83,189, filed, Oct. 8, 1987 assigned to the same assignee of the present application.

The present invention can apply to any semiconductor laser, no matter the light-shielding layer is of n-type or p-type. Hence, the above discussion on the thickness d, the distance $h_o$, the stripe width w, the thickness $H_1$, and the thickness $H_2$ can also apply to the laser shown in FIG. 25. The ridge portion of the second cladding layer 53 can be shaped like an inverted mesa as is illustrated in FIG. 21. Further, the second cladding layer 53 can include a second layer which functions a an etching stopper, just as in the modification of FIG. 22.

As has been explained, the InGaAlP semiconductor laser of the present invention, wherein the transverse mode oscillation can be controlled, can perform transverse mode oscillation at a small threshold current only if the aluminum ratio of the cladding layer and thickness d of the active layer falls within the ranges defined by the inequalities (30) and (31), respectively. Further, since the distance $h_o$ between the active layer and that portion of the light-shielding layer which contacts the flat portion of the second cladding layer falls within the range defined by the inequality (33), more preferably within the range specified by the inequality (34), the astigmatism is reduced. Still further, since the stripe width W falls within the range defined by the inequality (39), the laser according to the invention can perform stable transverse mode oscillation. Moreover, since the thickness $H_1$ and $H_2$ of the cladding layers satisfy the inequalities (45) and (46), the semiconductor laser has good thermal characteristics. Furthermore, in the case of the laser illustrated in FIG. 22, the p-type cladding layer, which has a thickness falling with the range specified by the inequality (48) and which functions as an etching stopper, does not affect the mode loss or the threshold current, and serves to control the size of the laser.

The present invention is not limited to the embodiments described above. For example, the inequalities (30) and (31) can apply to semiconductor lasers in which the light-shielding layer is made of material other than GaAs. Further, in the semiconductor laser shown in FIG. 10, 21, or 22, the conductivity types of the component layers can be reversed.

As has been described in detail, the present invention can provide a transverse-mode controllable InGaAlP semiconductor laser which can effect fundamental transverse-mode oscillation at a small threshold current.

There is the possibility that the current-blocking layer of the semiconductor laser shown in FIG. 10, 21, or 23, fails to function properly, allowing an electric current to flow through it. Another embodiment of the present invention, which has a current-blocking layer which properly blocks an electric current, will now be described, with reference to FIG. 26 through FIG. 31.

The semiconductor laser shown in FIG. 26 comprises an n-type GaAs substrate 111, an n-type GaAs buffer layer 112 formed on the substrate 111, a cladding layer 114 formed on the buffer layer 112 and made of n-type $In_{0.5}(Ga_{0.5}Al_{0.7})_{0.5}P$ doped with Si in concentration of 3 to $5 \times 10^{17}$ cm$^{-3}$, an active layer 115 formed on the cladding layer 113 made of undoped $In_{0.5}Ga_{0.5}P$, and a double-hetero junction structure formed on the active layer 114. The double-hetero junction structure consists of three cladding layers 116, 117, and 118. Layer 116 is made of p-type $In_{0.5}(Ga_{0.5}Al_{0.7})_{0.5}P$ doped with Zn in concentration of 1 to $5 \times 10^{17}$ cm$^{-3}$. The layer 117 is made of material having a low aluminum ratio, or p-type $In_{0.5}Ga_{0.50.5}P$ doped with Zn in concentration of 1 to $5 \times 10^{17}$ cm$^{-3}$. The Cladding layer 118 is shaped like a stripe and made of p-type $In_{0.5}(Ga_{0.3}Al_{0.7})_{0.5}P$ doped with Zn in concentration of 1 to $5 \times 10^{17}$ cm$^{-3}$. The layer 117 functions as an etching stopper in forming the ridge portion of the double-hetero junction structure. A capping layer 119 made of p-type $In_{0.5}Ga_{0.5}P$ is formed on the cladding layer 118. The layers 116, 117, and 118, and the capping layer 119 have such In ratio, Ga ratio, and Al ratio that the layers 116, 117, and 118 lattice constant is identical to that of the substrate 111, and that the layers 114 and 115 have band-gap energies greater than that the active layer 115. A current-blocking layer 119 having a thickness of 1.5 μm is formed on the sides of the double-hetero junction structure and also on the side of the contact layer 119. This layer 121 is made of GaAs doped with Si in concentration of $3 \times 10^{18}$ cm$^{-3}$. A contact layer 122 made of p-type GaAs is formed on the contact layer 119 and the current-blocking layer 121. A metal electrode 121 is deposited on the contact layer 122, and a metal electrode 122 is deposited on the lower surface of the GaAs substrate 111.

In the laser illustrated in FIG. 26, an electric current is blocked in the capping layer 119 and also in the current-blocking layer 121. As a result, light waves are guided through the stripe region of the mesacladding layer 118. The buffer layer 112 is used to improve the quality of the InGaAlP crystals of the InGaAlP layers. The capping layer 119 is used to reducing the electrical resistance between the cladding layer 118 and the contact layer 122. The capping layer 119 has a band-gap greater than that of the contact layer 122 and smaller than that of the cladding layer 118.

FIG. 27 shows the current-blocking section the laser illustrated in FIG. 26. As can be understood from FIG. 27, and as has been experimentally established, the reverse voltage of the current-blocking section greatly depend on the carrier concentration of the current-blocking layer 121. FIG. 28 represents the relationship between the carrier concentration and the reverse voltage. The "reverse voltage" is the voltage which is applied on the current-blocking section such that the p-type side and the n-type side are charged positively and negatively, respectively, thereby to cause a current of 1 mA to flow through the current-blocking section.

Figure 29:
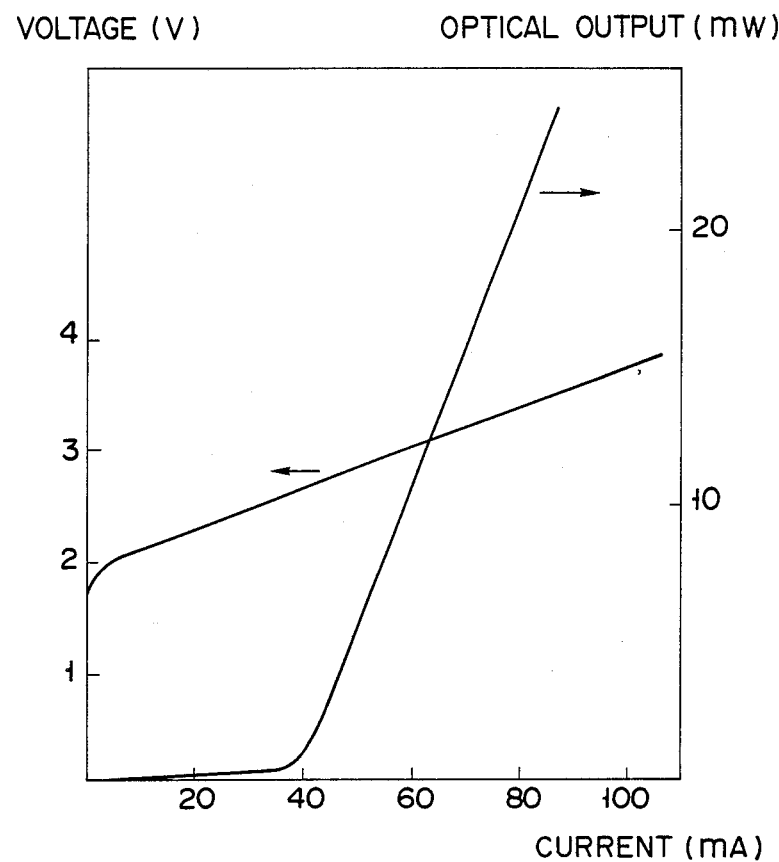
FIG. 29 is a diagram representing both the current-output characteristic and the current-voltage characteristic of the semiconductor laser shown in FIG. 2B.

According to the results of the experiments conducted by the inventors, the current-blocking section was easily turned on when the carrier concentration of the layer 119 is $1 \times 10^{18}$ cm$^{-3}$ or less. Hence, the voltage applied after the section had been turned on was the withstand voltage. As is evident from FIG. 29, the reverse voltage was 2V at most when the carrier concentration was $1 \times 10^{18}$ cm$^{-3}$ or less. FIG. 31 shows both the current-output characteristic and the current-voltage characteristic of the semiconductor laser shown in FIG. 26. As is shown in FIG. 29, since the laser could not perform its function when the reverse voltage was 2V or less, it is required that the carrier concentration of the current blocking layer is more than $1 \times 10^{18}$ cm$^{-3}$. The current-blocking section must have reverse voltage of 3V or more to enable the laser to produce a stable optical output ranging from 5 to 10 mW, as evident from FIG. 29. As is clear from FIG. 28, the reverse voltage was 3V or more when the current-blocking layer had carrier concentration of $1.5 \times 10^{18}$ cm$^{-}$ or more. Also, as is evident from FIG. 29, the current-blocking section must have a reverse voltage of 4V or more to enable the laser to produce an optical output over 20 mW. According to FIG. 28, the reverse voltage rose above 4V when the carrier concentration is $2.5 \times 10^{18}$ cm$^{-3}$. When the carrier concentration was $5 \times 10^{18}$ cm$^{-3}$ or more, the current-blocking section could hardly be easily turned on, and the reverse voltage increased to 10 V or more.

When the current-blocking layer 121 was made of GaAs doped with Si or Se, the carrier concentration was easily raised to $1.5 \times 10^{18}$ cm$^{-3}$ to $8 \times 10^{19}$ cm$^{-3}$. However, when the carrier concentration was $5 \times 10^{19}$ cm$^{-3}$ or more, the dopant, i.e., Si or Se, diffused from the current-blocking layer 119 into the cladding layer 115 or 116, drastically reducing the withstand voltage. When the dopant was Se, it diffused in some cases even at the carrier concentration of $1 \times 10^{19}$ cm$^{-3}$. When the dopant was Si, it did not diffuse as long as the carrier concentration remained less than $5 \times 10^{19}$ cm$^{-3}$, whereby the current-blocking section exhibited good withstand voltage characteristic.

As has been discussed, the reverse voltage characteristic of the current-blocking section much depends upon the carrier concentration of the currentblocking layer 119, and the carrier concentration must be $1.5 \times 10^{18}$ cm$^{-3}$ or more. Further, when the carrier concentration was $5 \times 10^{19}$ cm$^{-3}$ or more, the above-noted problem arose. In view of this, the carrier concentration should better be less $5 \times 10^{19}$ cm$^{-3}$.

Moreover, the results of the experiments also show that when the current-blocking layer 119 had carrier concentration ranging from $2.5 \times 10^{18}$ cm$^{-3}$ or more, but less than $1 \times 10^{19}$ cm$^{-3}$, the current-blocking section had reverse voltage characteristic good enough to enable the laser to produce an optical output of 10 mW or more, and the dopant did not diffuse from the layer 119 into any cladding layer. When the current-blocking layer 119 was of n-type, the minor carriers of the layer 119 were holes, and the diffusion length was only 1 $\mu$m or less. In this case, too, the currentblocking section had a sufficiently high withstand voltage even when the layer 119 absorbed light, provided that the carrier concentration fell within the range specified above.

When the stripe width W was 5 $\mu$m, the cavity length was 300 $\mu$m, the laser whose current-blocking layer had carrier concentration of $3 \times 10^{18}$ cm$^{-3}$, performed a single transverse-mode oscillation at the threshold current of 35 mA, providing an optical output of 20 mW. This laser kept on operating stably at 50° C. at power supply of 3 mW for 1000 hours or more.

As has been explained in detail, the present invention can provide a semiconductor laser of excellent characteristics. In the embodiment shown in FIG. 26, the first conductivity type is n-type, and the second conductivity type is p-type. Nonetheless, the conductivity types of the component layers can be reversed. Further, the etching stopper (i.e., the layer 116) interposed between the current-blocking layer 119 and the p-type cladding layer 115 can be dispensed with.

The semiconductor laser sown in FIG. 26 can operate reliably at a small threshold current since it has a section which readily blocks an electric current.

Still another embodiment of the present invention, which also has a current-blocking section, will now be described with reference to FIG. 30 and FIGS. 31A to 31F As is shown in FIG. 36 wherein same numeral denotes a same portion or section as in FIG. 26, this semiconductor laser comprises an n-type GaAs substrate 111, an n-type GaAs buffer layer 112 formed on the substrate 111, an n-type InGaP buffer layer 113 formed on the layer 112, an n-type InGaAlP cladding layer 114 formed on the layer 113, an InGaP active layer 115 formed on layer 114, and a double-tester junction structure formed on the active 115. The double-hetero junction structure consists of three p-type cladding layers 116, 117 and 118 -- all made of p-type InGaAlP. The cladding layer 117 can be made of either InGaP or material having a small aluminum ratio. The cladding layer 118 is shaped like a stripe. The laser further comprises a p-type InGaAlP capping layer 119 and a p-type GaAs contact layer 120, both formed on the cladding layer 118. A current-blocking layer 121 made of n-type GaAs doped with Si is formed on the sides of the double-hetero junction structure and also on the sides of the contact layer 120. A p-type GaAs contact layer 122 is formed on both the contact layer 120 and the current-blocking layer 121. A metal electrode 123 is deposited on the contact layer 122, and a metal electrode 124 is deposited on the lower surface of the substrate 111. In this structure, the current blocking operation and the light guiding operation is same as that of FIGS. 10, 22 and 26. The buffer layer 113 is used to improve the quality of the InGaAlP crystals of the InGaP layers. The capping layer 119 is used to reducing the electrical resistance between the cladding layer 118 and the contact layer 120 in a same manner show in FIG. 26. The capping layer 119 has a band-gap greater than that of the contact layer 120 and smaller than that of the cladding layer 118. The band gap of the capping layer 119 can be gradually changed from the cladding layer 118 toward the contact layer 120.

It will now be explained how the semiconductor laser shown in FIG. 32 is manufactured, with reference to FIGS. 33A to 33F.

First, as is shown in FIG. 33A, the first buffer layer 112 having a thickness of 0.5 $\mu$m and made of n-type GaAs doped with Si or Se in concentration of $1 \times 10^{18}$ cm$^{-3}$ is formed on the n-type GaAs substrate 111, by the MOCVD method under a pressure of 1 atom or less, by using a methyl-based, III-group organic metal such as trimethyl-indium, trimethyl-gallium, or trimethyl aluminum, and a hydride of V-group element such as arsine of phosphine. The substrate 111 is doped with Si in concentration of $3 \times 10^{18}$ cm$^{-3}$. Then, the second buffer layer 113 having a thickness of 0.5 $\mu$m and made of n-type InGaP doped with Se in concentration of $3 \times 10^{18}$ cm$^{-3}$ is formed on the first buffer layer 112. Further, the first cladding layer 114 having a thickness of 0.8 $\mu$m and made of n-type In$_{0.5}$Ga$_{0.15}$Al$_{0.35}$P doped with Si or Se in concentration of $1 \times 10^{18}$ cm$^{-3}$ is formed on the second buffer layer 113. Then, the active layer 115 having a thickness of 0.06 $\mu$m and made of undoped In$_{0.5}$Ga$_{0.5}$P is formed on the layer 114. The second cladding layer 116 having a thickness of 0.2 $\mu$m and made of p-type In$_{0.5}$Ga$_{0.15}$Al$_{0.35}$P doped with Zn or Mg in concentration of $2 \times 10^{18}$ cm$^{-3}$ is formed on the active layer 115. Further, the third cladding layer 117 functioning as an etching stopper, having a thickness of 50 $\mu$, and made of p-type InGaP doped with Zn or Mg in concentration of $2 \times 10^{18}$ cm$^{-3}$ is formed on the second cladding layer 116. The fourth cladding layer 118 having a thickness of 0.6 $\mu$m, and made of p-type In$_{0.5}$Ga$_{0.15}$Al$_{0.35}$P doped with Zn or Mg as the intermediate band gap in concentration of $2 \times 10^{18}$ cm$^{-3}$ is formed on the the third cladding layer 117. The capping layer 119 having a thickness of 0.05 $\mu$m, and made of p-type InGaP doped with Zn or Mg in concentration of $2 \times 10^{18}$ cm$^{-3}$ is formed on the fourth cladding layer 118. The contact layer 120 having a thickness of 0.5 $\mu$m, and made of p-type GaAs doped with Zn or Mg in concentration of $2 \times 10^{18}$ cm$^{-3}$ is formed on the capping layer 119. Hence, a double-hetero junction structure structure is formed. Then, the stripe-shaped SiO$_2$ layer 126 having a thickness of 0.1 $\mu$m and a width of 5 $\mu$m is formed on the contact layer 120 by means of thermal decomposition of the silane gas and photoetching.

Thereafter, as is shown in FIG. 31B, using the SiO$_2$ as a mask, the contact layer 120 was selectively etched with a GaAs-selective etchant, thereby exposing the capping layer 119, thereby forming the stripe-shaped GaAs mesa 127 having a width of 3 $\mu$m.

Next, as is illustrated in FIG. 31C, using the GaAs stripe-shaped GaAs layer 127 as a mask, the first capping layer 119 is etched, and the fourth cladding layer 118 is etched with an InGAlP-selective etchant, thereby exposing the third cladding layer 117, and thus forming a stripe-shaped mesa 128.

Figure 31D:
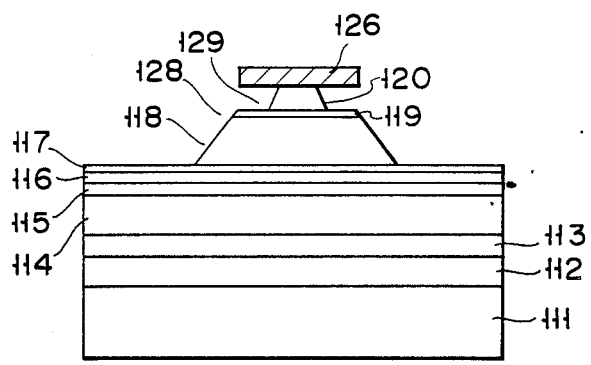

Further, as is shown in FIG. 31D, the contact layer 120 is etched with the GaAs-selective, thus narrowing the contact layer 120, and forming a stripe-shaped mesa 129. The GaAs-selective etchant is a mixture of 28% ammonium water, 35% hydrogen peroxide water, and water in the ratio of 1 : 30 : 9, and is applied at 20° C. The InGAlP-selective was sulfric acid or phosphoric acid, and is applied at 40 to 130° C.

Figure 31E:
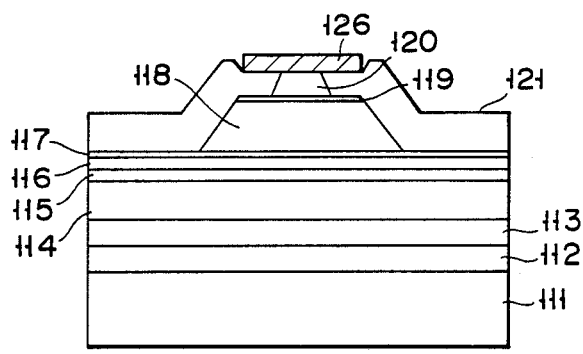

Then, as is illustrated in FIG. 31E, the currentblocking layer 121 having a thickness of 1.0 μm and made of n-type GaAs doped with Si in concentration of $3 \times 10^{18}$ cm$^{-3}$ is deposited by the MOCVD method under a reduced pressure, by using trimethylgallium and arsine as materials, and also by using silane (SiH$_4$) as doping gas. The GaAs current-blocking layer 121 was doped with Si by feeding a hydrogen-based mixture gas containing 100 ppm of SiH$_4$, into a reaction furnace at the rate 75 cc/min. In this case, the N-type GaAs current-blocking layer 121 grew at the speed of 3 μm/H. This growth was performed by introducing diluted phosphine gas into the furnace, heating the phosphine gas to 700° C., introducing arsine gas into the furnace, leaving the wafer to stand for one second or 2 to 3 seconds, and introducing trimethyl gallium gas into the furnace No GaAs grew on the SiO$_2$ layer 126, and the wafer shown in FIG. 31E was obtained.

Figure 31F:
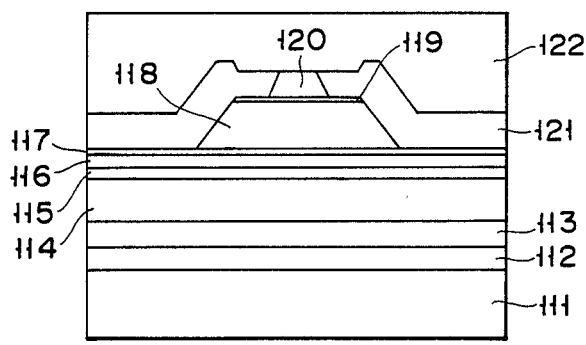

Next, as is shown in FIG. 31F, the contact layer 122 having a thickness of 1.5 μm and made of p-GaAs with Zn or Mg in concentration of $5 \times 10^{18}$ cm$^{-3}$ was grown by means of the the MOCVD method on the entire surface of the water. The Au/Zn electrode 123 and the Au/Ge electrode 124 were formed on the contact layer 122 and the lower surface of the substrate 11, respectively by the ordinary method known in the art. Thus, the wafer shown in FIG. 30 was manufactured The water was cut, and examined under an electron microscope to see whether or not silicon had diffused. No diffusion of silicon was observed The water was processed, thereby manufacturing a laser having a resonator length of 250 μm. The leakage current was successfully suppressed, unlike in the conventional semiconductor laser in which selenium is used as n-type dopant in the current-blocking layer. The laser according to the present invention exhibited good characteristics, such as threshold current of 60 mA and quantum efficiency of 20% for each side. The optical output increased to 20 mV with the drive current. In other words, te laser had excellent current-output characteristic. In addition, the laser both near-field and far-field pattern should single hole shape, and its mode could be well controlled.

The present invention is not limited to the embodiment shown in FIG. 32. It is not absolutely necessary to etch the embodiment, the second contact layer is etched after the fourth cladding layer has been etched, thus forming the stripe-shaped rib. Further, the second cladding layer made of InGaP and the third and fourth cladding layers, both made of p-type InGAlP, can be replaced by a single layer. Also, the concentration of the silicon doped in the current-blocking layer is not limited to $3 \times 10^{18}$ cm$^{-3}$; it ranges from $1 \times 10^{18}$ cm$^{-2}$ to $5 \times 10^{18}$ cm$^{-3}$.

A modification of the semiconductor laser shown in FIG. 32 was made which was different in that the n-type GaAs current-blocking layer 121 was 0.7 μm thick, regardless of the dopant contained in it, and that the distance between the upper surface of the flat portion of the layer 121 and the uper surface of the stripe-shaped portion of the fourth cladding layer 118 is 1.5 μm or less.

The modification, which had a resonator length of 250 μm, exhibited good characteristics such as threshold current of 60 mA and quantum efficiency of 20% for each side. No punch-through occurred to lessen the degree of current-blocking.

The results of the experiments conducted by the inventors showed that no punch-through took place when the current-blocking layer had a thickness of 0.7 μm or more and a dopant concentration of $1 \times 10^{18}$ cm$^{-3}$ to $5 \times 10^{18}$ cm$^{-3}$. When the n-type GaAs current-blocking layer was 0.5 μm thick, punch-through occurred in many laser elements. As has been pointed out, the distance between the upper surface of the flat portion of the current-blocking layer and the upper surface of the stripe-shaped portion of the fourth cladding layer must be 1.5 μm or less. If this distance is greater than 1.5 μm, the current-blocking layer will grow much so as to cover the stripe-shaped portion of the fourth cladding layer. In this case, the contact layer will grow on the stripe-shaped portion, failing to have a uniform thickness, or to bury the stripe-shaped portion in a desired manner.

The present invention can apply to a semiconductor laser made of materials other than those used in the embodiment described thus far. For instance, it can apply to a GaAlAs having an GaAs substrate, or an InGaAlAs or InGaAsP laser having an InGaAsP or GaAs substrate.

As has been described above, the present invention can provide a semiconductor laser, particularly an InGAlP laser in which the dopant does not diffuse from the current-blocking layer into the p-type cladding layer to lessen the degree of current-blocking, and which therefore excels in both the current-blocking efficiency and the optical-waveguide efficiency. Owing to the specific thickness and position of the current-blocking layer, no punch-through takes place in this layer. Therefore, the semiconductor laser can have good characteristics and can be manufactured with high yield and reciproducibility.

What is claimed is:

1. A semiconductor laser device for emitting a laser beam having a wavelength λ, comprising:

a double-hetero structure including:

an active layer made of In(Ga$_{1-y}$A$_y$)P and having a thickness d and a refractive index $n_a$, and first and second surfaces;

a first cladding layer of a first conductivity type formed on the first surface of the active layer having a refractive index $n_c$, made of In(Ga$_{1-x}$Al$_x$)P, where x and y satisfy the inequality of $0 \leq y < x \leq 1$; and a second cladding layer of a second conductivity type formed on the second surface of the active layer, having a refractive index $n_c^2$, and made of In(Ga$_{1-z}$Al$_z$)P, where y and z satisfy the inequality of $0 \leq y < z \leq 1$, wherein said double-hetero structure satisfies the following ineguality:

$$0.015\Delta^{-\frac{1}{2}} < d/\lambda < 0.028\Delta^{-\frac{1}{2}}$$

where is specific refractive index difference defined as:

$$\Delta = (\Delta_1 + \Delta_2)/2$$

$$\Delta_1 = (n_a^2 n_c^2)/2n_a 2)$$

and $$\Delta_2 = (n_a^2 n_{c2}^2)/2n_a 2)$$

2. The semiconductor laser device according to claim 1, wherein the thickness d of said active layer satisfies the following formula:

$$d/\lambda \approx 0.022\Delta^{-\frac{1}{2}}$$

3. The semiconductor laser device according to claim 1, wherein said first and second cladding layers have a thickness $H_1$ and a thickness $H_2$, respectively, which satisfies the following inequality;

$$0.08(\Delta_1 d/\lambda)^{-\frac{1}{2}} < H_1/\lambda < 0.12(\Delta_1 d/\lambda)^{-\frac{1}{2}}$$

and $$0.08(\Delta_2 d/\lambda)^{-\frac{1}{2}} < H_2/\lambda < 0.12(\Delta_2 d/\lambda)^{-\frac{1}{2}}$$

4. The semiconductor laser device according to claim 1, wherein said active layer is made of $In_{0.5}(Ga_{1-y}Al_y)_{0.5}P$, and said first and second cladding layers are made of $In_{0.5}(Ga_{1-x}Al_x)_{0.5}P$ and $In_{0.5}(Ga_{1-z}Al_z)_{0.5}P$, respectively.

5. The semiconductor laser device according to claim 1, wherein the thickness d of the active layer satisfies the following equality:

$$0.03 \ \mu m \leq d \leq 0.1 \ \mu m$$

and the x and z satisfies the following quality:

$$0.65 \leq x, z \leq 0.8$$

6. The semiconductor laser device according to claim 1, further comprising:
   a first contact layer formed on said first cladding layer at an opposite side of said active layer, and
   a second contact layer formed on said second cladding layer at an opposite side of said active layer and said double-hetero structure having a thickness $H_1$ and a thickness $H_2$, respectively, which satisfies the following inequality:

$$0.08(\Delta_1 d/\lambda)^{-\frac{1}{2}} < H_1/\lambda < 0.12(\Delta_1 d/\lambda)\Delta^{-\frac{1}{2}}$$

and $$0.08(\Delta_2 d/\lambda)^{-\frac{1}{2}} < H_2\lambda/\lambda < 0.12(\Delta_2 d/\lambda)^{-\frac{1}{2}}$$

7. The semiconductor laser device according to claim 3, wherein the thicknesses $H_1$ and $H_2$ satisfy the following inequality:

$$H_1/\lambda \approx 0.1(\Delta_1 d/\lambda)^{-\frac{1}{2}}$$

and $$H_2/\lambda \approx 0.1(\Delta_2 d/\lambda)^{-\frac{1}{2}}$$

8. The semiconductor laser device for emitting a beam having a wavelength $\Delta$, comprising:
   a semiconductor substrate of a first conductivity type;
   an active layer made of $In_{1-v}(Ga_{1-y}Al_y)_v P$ and having a thickness d, and having first and second surfaces, which satisfies the inequality of $0.03 \ \mu m \leq d \leq 0.1 \ \mu m$;
   a first cladding layer of the first conductivity type formed between the substrate and the first surface of said active layer and made of $In_{1-v}(Ga_{1-x}Al_x)_v P$, where v is a composition ratio satisfy the inequality of $0 \leq v \leq 1$;
   a cladding structure including a second cladding layer of a second conductivity type formed on the second surface of the active layer having a refractive index $n_c$, made of $In_{1-v}(Ga_{1-z}Al_z)_v P$, and having a flat section an a stripe-shaped ridge section projecting from the flat section, where composition ratio x, y and z satisfying the inequality of $0 \leq y < x$, $z \leq 1$, the aluminum ratio x and z of the second cladding layers being satisfy the inequality of $0.65 \leq x, z \leq 0.8$; and
   a confining layer formed on the flat section of the second cladding layer for confining the laser beam.

9. The semiconductor laser device according to claim 8, wherein said beam confining layer is made of $Ga_{1-r}Al_rAs$, where $0 < r < 1$.

10. The semiconductor laser device according to claim 8, wherein said semiconductor substrate and said laser beam-confining layer are made of GaAs.

11. The semiconductor laser device according to claim 8, wherein the flat portion of said cladding structure has a thickness $h_o$ which satisfies the following inequality:

$$h_o/\lambda \leq 0.13(\Delta d_2 d/\lambda)^{-\frac{1}{2}}$$

where d is the thickness of said active layer, $\lambda$ is the wavelength of the beam, and $\Delta d_2 (=z-y)$ is the difference between the aluminum ratio of said second cladding layer and that of said active layer.

12. The semiconductor laser device according to claim 8, wherein said ridge section, which contacts said flat section, has a width W which satisfies the following inequality:

$$W/\lambda \leq 20[h_o/\lambda](\Delta x_2 d/\lambda)^{1/4}$$

where d is the thickness of said active layer, $\lambda$ is the wavelength of the beam, and $\Delta x_2 (=z-y)$ is the difference between the aluminum ratio of said second cladding layer and that of said active layer.

13. The semiconductor laser device according to claim 8, wherein said first cladding layer has a thickness $H_1$, and said second cladding layer at the striped shaped ridge section has a thickness $H_2$, said thicknesses $H_1$ and $H_2$ satisfying the following inequalities, respectively:

$$0.25(\Delta x_1 d/\lambda)^{-\frac{1}{2}} \leq H_1/\lambda \leq 0.38(\Delta x_1 d/\lambda)^{-\frac{1}{2}}$$

$$0.25(\Delta x_2 d/\lambda)^{-\frac{1}{2}} \leq H_2/\lambda \leq 0.38(\Delta x_2 d/\lambda)^{-\frac{1}{2}}$$

where $\Delta x_1 (=z-y)$ is the difference between the aluminum ratio of said first cladding layer and that of said active layer, and $\Delta x_2 (=z-y)$ is the difference between the aluminum ratio of said second cladding layer and that of said active layer.

14. The semiconductor laser device according to claim 8, wherein the ridge section of said cladding structure includes a third cladding layer formed on said second cladding layer and made of $In_{1-y}(Ga_{1-s}Al_s)_y P$, and a fourth cladding layer formed on the third cladding layer and made of $Inl-c(Gal-uAlu)vP$, where $0 \leq u < s$.

15. The semiconductor laser device according to claim 14, wherein said third cladding layer has a thickness t which satisfies the following inequality:

$$45 \ \text{Å} \leq t \leq 200 \ \text{Å}.$$

16. The semiconductor laser device according to claim 8, wherein the aluminum ratio X of the first cladding layer, and the aluminum ratio y of the second cladding layer are 0.7.

17. The semiconductor laser device according to claim 15, wherein said laser beam-confining layer is made of $Ga_{1-w}Al_wAs$ of the first conductivity type, where $0 \leq w < 1$, and has a carrier concentration D which satisfies the following inequality:

$$1.0 \times 10^{18} \text{ cm}^{-3} \leq D \leq 5 \times 10^{19} \text{ cm}^{-3}$$

18. The semiconductor laser device according to claim 15, wherein said semiconductor substrate and said beam-confining layer are made of n-type GaAs.

19. The semiconductor laser device according to claim 16, wherein Si is doped, as an impurity, in said laser beam-confining layer.

20. The semiconductor laser device according to claim 15, wherein said beam-confining layer has a carrier concentration D given as follows: $2.5 \times 10^{18}$ $\text{cm}^{-3} \leq D \leq 1 \times 10^{19} \text{ cm}^{-3}$.

21. The semiconductor laser device according to claim 20, wherein said beam-confining layer has an impurity concentration ranging from $1 \times 10^{18}$ $\text{cm}^{-2}$ to $3 \times 10^{18} \text{ cm}^{-3}$.

22. The semiconductor laser device according to claim 13, further comprising at least one second capping layer of the second conductivity type, interposed between said second contact layer and said cladding structure, and having a band gap greater than that of said substrate and less than that of said cladding structure.

23. The semiconductor laser device according to claim 8, wherein said laser beam-confining layer has a thickness of at least 0.7 μm, and a height not greater than 1.5 μm which is measured from the ridge of said cladding structure.

* * * * *

UNITED STATES PATENT AND TRADEMARK OFFICE
CERTIFICATE OF CORRECTION

PATENT NO. : 4,893,313

DATED : January 9, 1990

INVENTOR(S) : GENICHI HATAKOSHI ET AL

It is certified that error appears in the above-identified patent and that said Letters Patent is hereby corrected as shown below:

Column 3, line 33, change "$In(Ga_{i-y}Aly)P$" to --$In(Ga_{I-y}Al_y)P$--;

line 38, change "$In(Ga_{i-y}AlyP,$" to --$In(Ga_{1-x}Al_x)P$--;

line 42, change "$nc_2,$" to --$n_{c2},$--, also, change "$In(Ga1-zAlz)P,$" to --$In(Ga_{1-z}Al_z)P,$--;

line 50, change "where .is" to --where $\Delta$ is--;

line 64, change "$In_{i-v}(Ga_{i-y}Aly)v^P$" to --$In_{I-v}(Ga_{1-y}Al_y)_v P$--.

Column 4, line 1, change "$In_{i-v}(Ga_{i-x}Al_x)v^P$" to --$In_{1-v}(Ga_{1-x}Al_x)_v P$--;

line 7, change "$In_{i-v}(Ga_{i-z}Al_z)v^P$" to --$In_{1-v}(Ga_{1-z}Al_z)_v P$--.

Column 5, last line, change "$In_{0.5}(Ga_{i-x}Ag_x)_{0.5}P$" to --$In_{0.5}(Ga_{1-x}Al_x)_{0.5}P$--.

Column 6, line 3, change "$In_{0.5}(Ga_{i-x}$" to --$In_{0.5}(Ga_{1-x}$--;

line 4, change "$Ag_x)_{0.5}P$" to --$Al_x)_{0.5}P$--.

Column 7, line 14, change "$\Delta \approx 0.1\Delta X$" to --$\Delta \approx 0.1\Delta x$--;

UNITED STATES PATENT AND TRADEMARK OFFICE
CERTIFICATE OF CORRECTION

PATENT NO. : 4,893,313
DATED : January 9, 1990
INVENTOR(S) : Genichi Hatakoshi, et al It is certified that error appears in the above-identified patent and that said Letters Patent is hereby corrected as shown below:

line 35, change "$\Gamma_a=[d+2\gamma/2K_o^2n_a^2\Delta)\}/(d+2/\gamma)$" to --$\Gamma_a=[d+2\gamma/2k_o^2n_a^2\Delta)\}/(d+2/\gamma)$--;

line 67, change "$d^2=(1/\Delta)\{a_i+(1/R)\}/(k_o^2n_a^2J_o\beta)$" to --$d^2=(1/\Delta)\{a_i+(1/L)\ell n(1/R)\}/(k_o^2n_a^2J_o\beta)$--.

Column 8, line 6, change "$d/\lambda=\Delta^{-\frac{1}{2}}\{a_i+(1/L)Ln(1/R)\}/(J_o\beta)^{\frac{1}{2}}/2\pi n_a$" to --$d/\lambda=\Delta^{-\frac{1}{2}}\{a_i+(1/L)\ell n(1/R)\}/J_o\beta)^{\frac{1}{2}}/2\pi n_a$--.

Column 9, line 26, change "$\alpha=\Gamma_c'=\Gamma_c\exp(-2\gamma H)$" to --$\Gamma_c'=\Gamma_c\exp(-2\gamma H)$--;

line 39, change "$\gamma H=K_o^2n_a^2\Delta dH$" to --$\gamma H=k_o^2n_a^2\Delta dH$--.

Column 10, line 39, change "$In_{0.5}(Ga_{1-x}Al_x)_{0.5}$" to --$In_{0.5}(Ga_{1-x}Al_x)_{0.5}$--.

Column 11, line 40, change "$\neq$" to --$\Delta$--;

line 50, change "$In_{0.5}(Ga_{1-x}Al_x)_{0.5}P$" to --$In_{0.5}(Ga_{1-x}Al_x)_{0.5}P$--; same line, change "$\eta_{c1}$" to --$n_{c1}$--;

line 51, change "$In_{0.5}(Ga_{1-z}Al z)_{0.5}P$" to --$In_{0.5}(Ga_{1-z}Al_z)_{0.5}P$--;

line 52, change "$\eta_{c2}$" to --$n_{c2}$--;

UNITED STATES PATENT AND TRADEMARK OFFICE
CERTIFICATE OF CORRECTION

PATENT NO. : 4,893,313
DATED : January 9, 1990
INVENTOR(S) : Genichi Hatakoshi et al It is certified that error appears in the above-identified patent and that said Letters Patent is hereby corrected as shown below:

line 61, change "$\Delta'=\{(\Delta_1+_2)/2\}\{1+(\Delta_1+_2)^2/(4\Delta_1\Delta_2)\}/2$" to --$\Delta'=\{(\Delta_1+\Delta_2)/2\}\{1+(\Delta_1+\Delta_2)^2/(4\Delta_1\Delta_2)\}/2$--;

line 64, change "$\Delta_1=(n_a^2-_{nc1}^2)/(2n_a^2)$" to --$\Delta_1=(n_a^2-n_{c1}^2)/(2n_a^2)$--.

Column 12, line 1, change "$\eta_{c1}$ and $\eta_{c2}$" to --$n_{c1}$ and $n_{c2}$--;

line 36, change "In(Ga," to --In(Ga$_1$--;

line 37, change "In(Ga$_{1-x}$Al$_x$)P" to --In(Ga$_{1-x}$Al$_x$)P--.

Column 13, line 37, change "In$_{0.5}$(Ga$_{1-x}$Al$_x$)$_{0.5}$P" to --In$_{0.5}$(Ga$_{1-x}$Al$_x$)$_{0.5}$P--;

line 38, change "In$_{0.5}$(Ga$_{1-x}$Al$_x$)$_{0.5}$P" to --In$_{0.5}$(Ga$_{1-x}$Al$_x$)$_{0.5}$P--.

Column 16, line 21, change "$h_o \propto \Delta x^{-178}$" to --$h_o \propto \Delta x^{-\frac{1}{2}}$--;

line 41, change "$h_o/\lambda 0.09(\Delta xd/\lambda)^{-178}$" to --$h_o/\lambda \leq 0.09(\Delta xd/\lambda)^{-\frac{1}{4}}$--.

Column 17, line 35, change "$W \propto h_o^{\frac{1}{2}}$" to --$W \propto h_o^{\frac{1}{4}}$--;

line 55, change "(1/L)n(1/R)" to --

UNITED STATES PATENT AND TRADEMARK OFFICE
CERTIFICATE OF CORRECTION

PATENT NO. : 4,893,313

DATED : January 9, 1990

INVENTOR(S) : Genichi Hatakoshi et al

It is certified that error appears in the above-identified patent and that said Letters Patent is hereby corrected as shown below:

$(1/L)\ell n(1/R)$ --;

line 65, change "$W/\lambda 20[(h_o/\lambda)(\Delta x d\lambda)^{178}]^{1/3}$" to --$W/\lambda \leq 20[(h_o/\lambda)(\Delta x d\lambda)^{1/2}]^{1/4}$--.

Column 18, line 15, change "$W/\lambda \leq 13[(h_o/\lambda)\Delta x d/\lambda^{1/2}]^{1/4}$" to --$W/\lambda \leq 13[(h_o/\lambda)\Delta x d/\lambda^{1/2}]^{1/4}$--;

line 41, change "$\Delta x_1 = \Delta x_2 = Ax$" to --$\Delta x_1 = \Delta x_2 = \Delta x$--;

line 63, change "<011>" to --<01$\bar{1}$>--.

Column 19, line 18, change "$In0.5(Ga_{1-z}Alz)0.5$" to --$In_{0.5}(Ga_{1-z}Al_z)_{0.5}P$--;

line 19, change "$In0.5(Ga_{1-u}Alu)0.5$" to --$In_{0.5}(Ga_{1-u}Al_u)_{0.5}P$--;

line 20, change "$In0.5(Ga_{1-s}Als)0.5$" to to --$In_{0.5}(Ga_{1-s}Al_s)_{0.5}P$--;

line 25, change "$In0.5(Ga_{1-}$" to --$In_{0.5}(Ga_{1-}$--;

line 26, change "$_uAlu)0.5$" to --$_uAl_u)_{0.5}P$--;

UNITED STATES PATENT AND TRADEMARK OFFICE
CERTIFICATE OF CORRECTION

PATENT NO. : 4,893,313

DATED : January 9, 1990

INVENTOR(S) : Genichi Hatakoshi et al

Page 5 of 8

It is certified that error appears in the above-identified patent and that said Letters Patent is hereby corrected as shown below:

same line, change "In0" to --In--;

line 27, change "S(Ga$_{1-u}$Alu)0.5" to --$_{0.5}$(Ga$_{1-u}$Al$_u$)$_{0.5}$P--;

second line from bottom, change "λ0.67 μm" to --λ=0.67 μm--.

Column 20, line 22, change "In0.5(Ga$_{0.3}$Al$_{0.7}$)$_{0.5}$P" to --In$_{0.5}$(Ga$_{0.3}$Al$_{0.7}$)$_{0.5}$P--.

Column 21, line 46, change "In$_{0.5}$Ga$_{0.50.5}$P" to --In$_{0.5}$Ga$_{0.5}$P--.

Column 22, line 44, change "cm$^{\cdot}$" to --cm$^{-3}$--.

Column 26, line 46, change "In(Ga$_{1-y}$Ay)P" to --In(Ga$_{1-y}$Al$_y$)P--;

line 56, change "n$_c^2$" to --n$_{c2}$--;

line 61, after "where" insert --Δ--;

line 62, change "Δ=(Δ$_i$+Δ$_2$)/2" to --Δ=(Δ$_1$+Δ$_2$)/2--;

line 65, change "Δ$_1$=(n$_a^2$n$_c^2$)/2n$_a$2)" to --Δ$_1$=(n$_a^2$-n$_c^2$)/(2n$_a^2$)--

UNITED STATES PATENT AND TRADEMARK OFFICE
CERTIFICATE OF CORRECTION

PATENT NO. : 4,893,313
DATED : January 9, 1990
INVENTOR(S) : Genichi Hatakoshi et al It is certified that error appears in the above-identified patent and that said Letters Patent is hereby corrected as shown below:

line 67, change "$\Delta_2=(n_a^2 n_{c2}^2)/2n_a 2)$" to --$\Delta_2=(n_a^2-n_{c2}^2)/(2n_a^2)$--.

Column 27, line 14, change "$0.08A_2 d/\lambda)^{-\frac{1}{2}}<H_2/\lambda<0.12(\Delta_2 d/\lambda)^{-\frac{1}{2}}$" to --$0.08\Delta_2 d/\lambda)^{-\frac{1}{2}}<H_2/\lambda<0.12(\Delta_2 d/\lambda)^{-\frac{1}{2}}$--;

line 22, change "equality" to --inequality--;

line 26, change "quality" to --inequality--;

line 39, change "$0.08\{_1 d/\lambda)^{-\frac{1}{2}}<H_1/\lambda<0.12(\Delta_1 d/\lambda)\Delta^{-\frac{1}{2}}$" to --$0.08\{\Delta_1 d/\lambda)^{-\frac{1}{2}}<H_1/\lambda<0.12(\Delta_1 d/\lambda)^{-\frac{1}{2}}$--;

line 43, change "$0.08(\Delta_2 d/\lambda)^{-\frac{1}{2}}<H_2\lambda/\lambda<0.12(\Delta_2 d/\lambda)^{-\frac{1}{2}}$" to --$0.08(\Delta_2 d/\lambda)^{-\frac{1}{2}}<H_2/\lambda<0.12(\Delta_2 d/\lambda)^{-\frac{1}{2}}$--;

line 48, change "$H_1/\lambda \approx 0.1(\Delta_1 d/\lambda)_{-\frac{1}{2}}$" to --$H_1/\lambda \approx 0.1(\Delta_1 d/\lambda)^{-\frac{1}{2}}$--;

line 55, change "$\Delta$" to --$\lambda$--.

Column 28, line 4, delete "second";

line 11, change "$0<r<1$" to --$0 \leq r \leq 1$--;

line 20, change "$h_o/\lambda \leq 0.13(\Delta d_2 d/\lambda)^{-\frac{1}{2}}$" to

UNITED STATES PATENT AND TRADEMARK OFFICE
CERTIFICATE OF CORRECTION

PATENT NO. : 4,893,313
DATED : January 9, 1990
INVENTOR(S) : Genichi Hatakoshi et al It is certified that error appears in the above-identified patent and that said Letters Patent is hereby corrected as shown below:

$--h_o/\lambda \leq 0.13(\Delta x_2 d/\lambda)^{-\frac{1}{2}}--$;

line 24, change "$\Delta d_2$" to $--\Delta x_2--$;

line 32, change "$W/\lambda \leq 20[h_o/\lambda)(\Delta x_2 d/\lambda)^{\frac{1}{2}}]^{\frac{1}{4}}$" to $--W/\lambda \leq 20[(h_o/\lambda)(\Delta x_2 d/\lambda)^{\frac{1}{2}}]^{\frac{1}{4}}--$;

line 44, change "$0.25(\Delta x_1 d/\lambda)^{-\frac{1}{2}} \leq H_1/\lambda \leq 0.38 (\Delta x_1 d/\lambda)^{-\frac{1}{2}}$" to $--0.25(\Delta x_1 d/\lambda)-\frac{1}{2} \leq H_1/\lambda \leq 0.38 (\Delta x_1 d/\lambda)^{-\frac{1}{2}}--$;

line 46, change "$0.25(\Delta x_2 d/\lambda)^{-\frac{1}{2}} \leq H_2/\lambda \leq 0.38 (\Delta x_2 d/\lambda)^{-\frac{1}{2}}$" to $--0.25(\Delta x_2 d/\lambda)-\frac{1}{2} \leq H_2/\lambda \leq 0.38 (\Delta x_2 d/\lambda)^{-\frac{1}{2}}--$;

line 48, change "$\Delta x_1 (=z-y)$" to $--\Delta x_1 (=x-y)--$;

line 56, change. "$In_{1-v}(Ga_{1-s}Al_s)_v P$" to $--In_{1-v}(Ga_{1-u}Al_u)_v P--$;

line 58, change "Inl-c(Gal-uAlu)vP" to $--In_{1-v}(Ga_{1-s}Al_s)_v P--$;

line 67, change "X" to --x--.

Column 29, line 2, change "15" to --8--;

line 12, change "15" to --17--;

line 19, change "15" to --17--.

UNITED STATES PATENT AND TRADEMARK OFFICE
CERTIFICATE OF CORRECTION

PATENT NO. : 4,893,313

DATED : January 9, 1990

INVENTOR(S) : Genichi Hatakoshi et al

It is certified that error appears in the above-identified patent and that said Letters Patent is hereby corrected as shown below:

Column 30, line 5, change "20" to --17--;

line 13, change "substrate" to --second contact layer--; same line, change "cladding structure" to --second cladding layer--.

Signed and Sealed this

Thirtieth Day of June, 1992

Attest:

DOUGLAS B. COMER

Attesting Officer

Acting Commissioner of Patents and Trademarks